(12) United States Patent
Kinoshita

(10) Patent No.: US 7,589,384 B2
(45) Date of Patent: Sep. 15, 2009

(54) SEMICONDUCTOR DEVICE INCLUDING AN ELECTROSTATIC DISCHARGE PROTECTION ELEMENT

(75) Inventor: Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 11/404,075

(22) Filed: Apr. 14, 2006

(65) Prior Publication Data

US 2007/0052031 A1 Mar. 8, 2007

(30) Foreign Application Priority Data

Sep. 2, 2005 (JP) ............................. 2005-255124

(51) Int. Cl.
*H01L 23/62* (2006.01)
(52) U.S. Cl. ...................... 257/355; 257/357
(58) Field of Classification Search ......... 257/347–355, 257/E29.008, E29.015
See application file for complete search history.

(56) References Cited

U.S. PATENT DOCUMENTS 6,624,487 B1 * 9/2003 Kunz et al. ................. 257/409
6,867,103 B1 * 3/2005 Yu .............................. 438/289
7,211,864 B2 * 5/2007 Seliskar ...................... 257/347

FOREIGN PATENT DOCUMENTS

JP 05-067777 3/1993

* cited by examiner

*Primary Examiner*—Cuong Q Nguyen
(74) *Attorney, Agent, or Firm*—Finnegan, Henderson, Farabow, Garrett & Dunner, L.L.P.

(57) ABSTRACT

It is made possible to easily set a protection voltage even when a semiconductor device to be protected includes a gate insulating film having a low dielectric breakdown voltage. A semiconductor device includes: a MOS transistor including a first gate insulating film provided on a first element region of first conductivity-type in a semiconductor, a first gate electrode provided on the first gate insulating film, and first impurity regions of second conductivity-type provided in the first element region on both sides of the first gate electrode; and an ESD protection element including a second gate insulating film provided on a second element region of first conductivity-type in the semiconductor substrate and having substantially the same thickness as the first gate insulating film, a second gate electrode provided on the second gate insulating film and connected to the first gate electrode, and second impurity regions of second conductivity-type provided in the second element region on both sides of the second gate electrode.

17 Claims, 28 Drawing Sheets

SECTION A-A

SECTION B-B

SECTION A-A

SECTION A-A

SECTION A-A

SECTION A-A

SECTION A-A

SECTION A-A

SECTION B-B

SECTION A-A

SECTION B-B

SECTION A-A

SECTION B-B

SECTION A-A

SECTION B-B

SECTION A-A

SECTION B-B

SECTION A-A

SECTION B-B

US 7,589,384 B2

SEMICONDUCTOR DEVICE INCLUDING AN ELECTROSTATIC DISCHARGE PROTECTION ELEMENT

CROSS-REFERENCE TO RELATED APPLICATION

This application is based upon and claims the benefit of priority from prior Japanese Patent Application No. 2005-255124 filed on Sep. 2, 2005 in Japan, the entire contents of which are incorporated herein by reference.

BACKGROUND OF THE INVENTION

1. Field of the Invention

The present invention relates to a semiconductor device and a method for manufacturing the same, and more particularly to an ESD (Electrostatic Discharge) protection element for protecting the inside of an LSI from a surge current and the like.

2. Related Art

When static electricity built up on a machine or human body is applied to an electronic circuit of a semiconductor integrated circuit during manufacturing or in use, there is a possibility that a gate insulating film is damaged by high voltage. Such a phenomenon is known as ESD breakdown. Therefore, most semiconductor devices have a semiconductor element or circuit called an ESD protection element for preventing the inflow of an externally applied surge current, thereby preventing ESD breakdown of a gate insulating film.

Meanwhile, field effect transistors that are basic elements of a semiconductor integrated circuit have been scaled down as performance thereof has been improved. In recent years, it is not uncommon that field effect transistors have thin gate insulating films having an equivalent oxide thickness of about 1 nm. The dielectric breakdown voltage of a gate insulating film is significantly lowered as the thickness of the gate insulating film is decreased, and therefore a surge voltage to be prevented by an ESD protection element (hereinafter, simply referred to as a "protection voltage") is also lowered as the dielectric breakdown voltage is lowered.

However, it is difficult to arbitrarily control the protection voltage of an ESD protection element. Particularly, in recent years, it has become very difficult to set the protection voltage to a low value appropriate to a very thin gate insulating film.

Against this backdrop, a method which makes it easy to set a protection voltage by using a MOS diode as a protection element has been reported (see, for example, Japanese Patent Laid-open No. 5-67777). However, since this known method is based on a wrong understanding that thin insulating films are not damaged by F-N (Fowler-Nordheim) current, its first concern is to suppress fluctuations in threshold voltage. For this reason, this method uses a normal MOS diode as a protection element. As a result, the resistance of the protection element is high when the protection element is in ON-state so that it is not possible to dissipate voltage quickly. In addition, it is necessary for the protection element to have an insulating film thinner than that of an element to be protected to adjust a protection voltage. However, it is difficult to form such a thin insulating film.

As described above, conventional ESD protection elements have a problem in that it is difficult to set a protection voltage to protect a very thin gate insulating film.

SUMMARY OF THE INVENTION

Under the circumstances, it is an object of the present invention to provide a semiconductor device comprising an ESD protection element whose protection voltage can be easily set even when the semiconductor device includes a gate insulating film having a low dielectric breakdown voltage and a method for manufacturing such a semiconductor device.

A semiconductor device according to a first aspect of the present invention includes: a semiconductor substrate including first and second element regions of first conductivity-type isolated from each other; a MOS transistor including a first gate insulating film provided on the first element region, a first gate electrode provided on the first gate insulating film, and first impurity regions of second conductivity-type provided in the first element region on both sides of the first gate electrode; and an ESD protection element including a second gate insulating film provided on the second element region and having substantially the same thickness as the first gate insulating film, a second gate electrode provided on the second gate insulating film and connected to the first gate electrode, and second impurity regions of second conductivity-type provided in the second element region on both sides of the second gate electrode.

A semiconductor device according to a second aspect of the present invention includes: a semiconductor substrate including first and second element regions of first conductivity-type isolated from each other; a MOS transistor including a first gate insulating film provided on the first element region, a first gate electrode provided on the first gate insulating film, and first impurity regions of second conductivity-type provided in the first element region on both sides of the first gate electrode; and an ESD protection element including a second gate insulating film provided on the second element region and having substantially the same thickness as the first gate insulating film, a second gate electrode provided on the second gate insulating film and connected to the first gate electrode, and second impurity regions of second conductivity-type provided in the second element region on both sides of the second gate electrode, each of the second impurity regions of the ESD protection element being offset with respect to the second gate electrode.

A method for manufacturing a semiconductor device according to a third aspect of the present invention includes: forming a film of a gate insulating material on first and second element regions of first conductivity-type isolated from each other and provided in a semiconductor substrate; forming a film of an electrode material on the film of a gate insulating material; patterning the film of a gate insulating material and the film of an electrode material to form a first gate insulating film and a first gate electrode on the first element region and to form a second gate insulating film and a second gate electrode on the second element region; implanting second conductivity-type impurity ions into only the first element region by using the first gate electrode as a mask to form extension regions; forming first and second gate side walls made of an insulating material on the side faces of the first and second gate electrodes, respectively; and implanting second conductivity-type impurity ions into the first and second element regions by using the first and second gate side walls and the first and second gate electrodes as a mask to form first and second impurity regions.

DETAILED DESCRIPTION OF THE INVENTION

Hereinbelow, embodiments of the present invention will be described in detail with reference to the accompanying drawings.

First Embodiment

Figure 1:
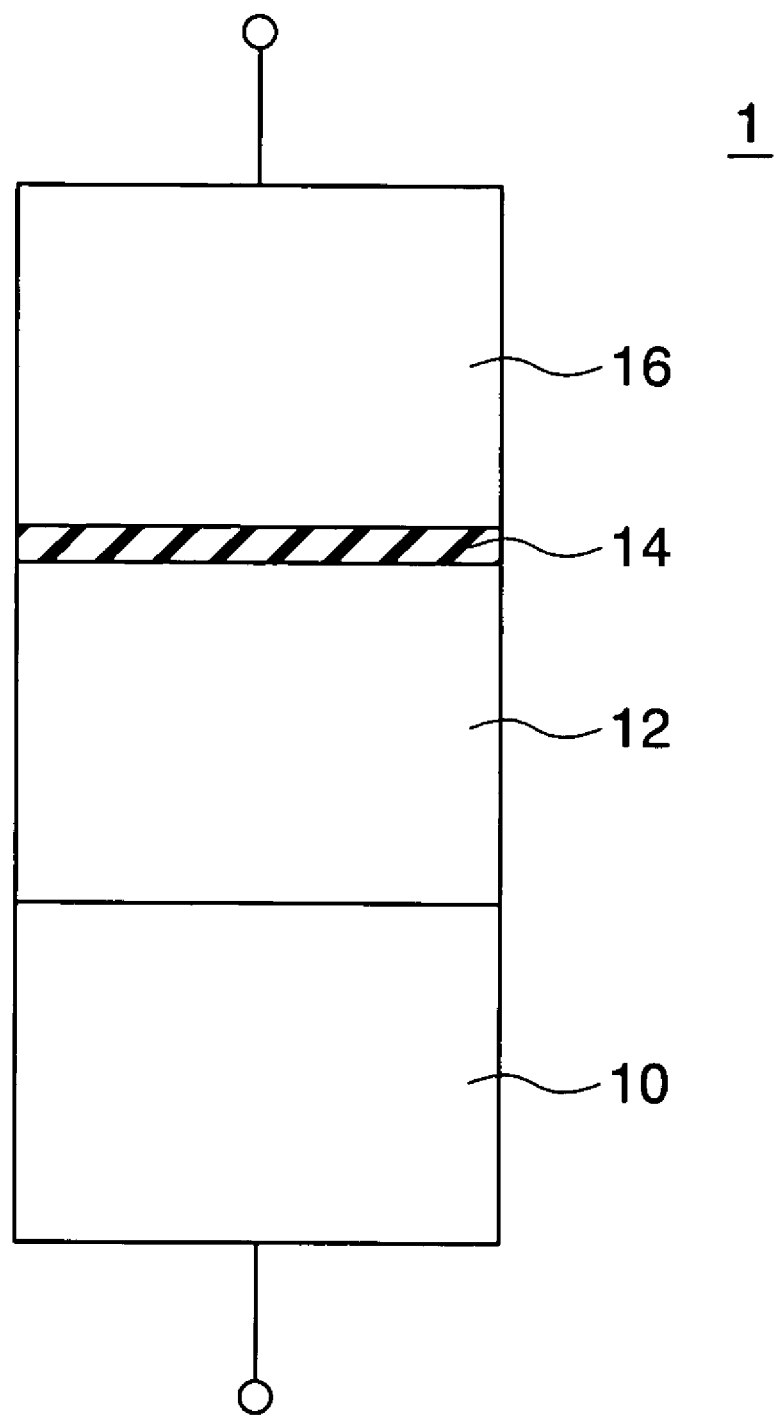
FIG. 1 is a cross-sectional view of an ESD protection element according to a first embodiment of the present invention.

FIG. 1 shows an ESD (Electrostatic Discharge) protection element 1 according to a first embodiment of the present invention. The protection element 1 according to the first embodiment is a tunnel diode, and is used to protect an n-type channel MOSFET. The protection element 1 according to the first embodiment includes an $n^+$ silicon layer 10, a $p^-$ silicon layer 12 joined to the $n^+$ silicon layer 10, an insulating film 14 provided on the $p^-$ silicon layer 12, and an $n^+$ silicon electrode 16 provided on the insulating film 14. The $n^+$ silicon layer 10 is connected to ground potential and the $n^+$ silicon electrode 16 is connected to an external electrode.

Figure 2:
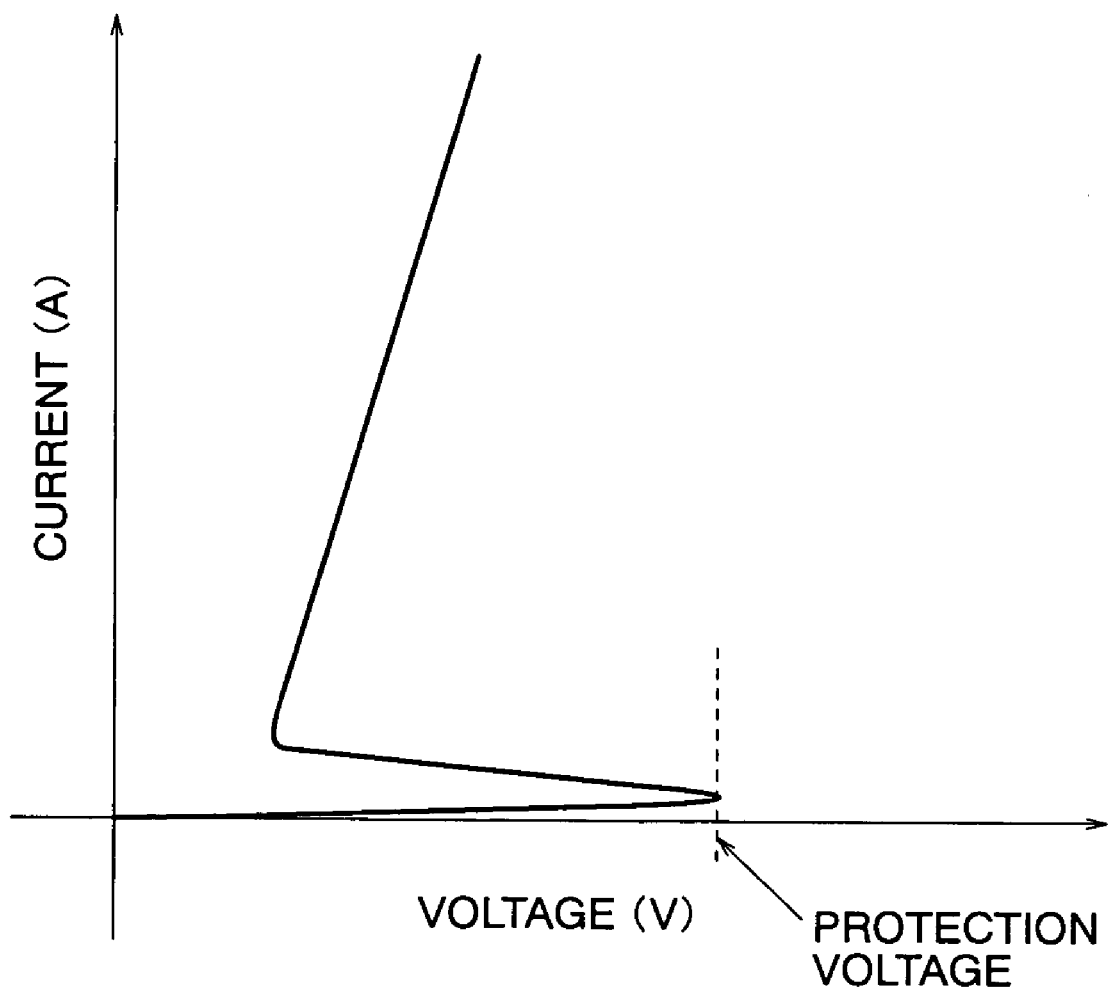
FIG. 2 shows the current-voltage characteristics of the ESD protection element according to the first embodiment.
Figure 3:
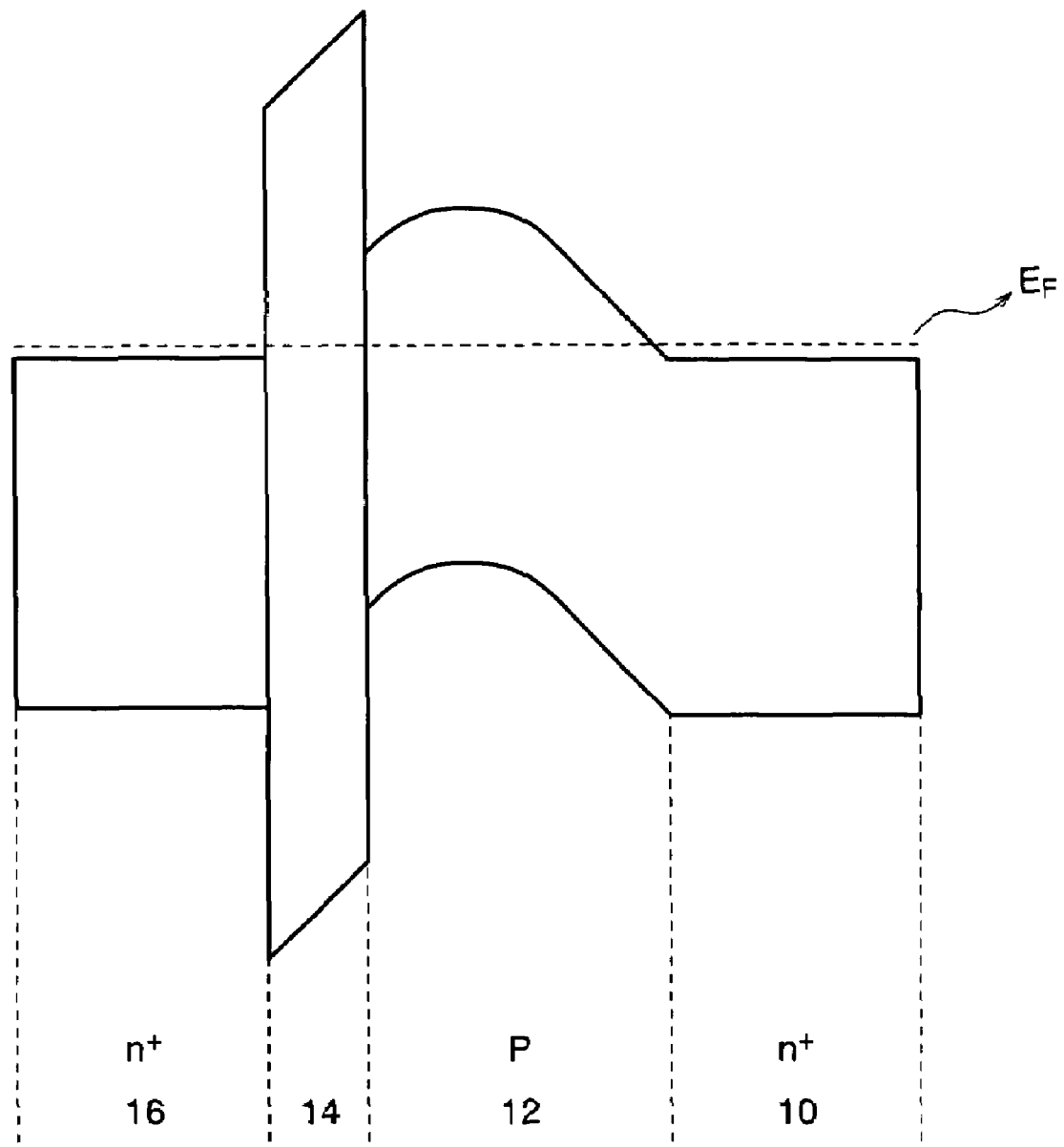
FIG. 3 is an energy band diagram of the ESD protection element according to the first embodiment at the time when no voltage is applied.
Figure 4:
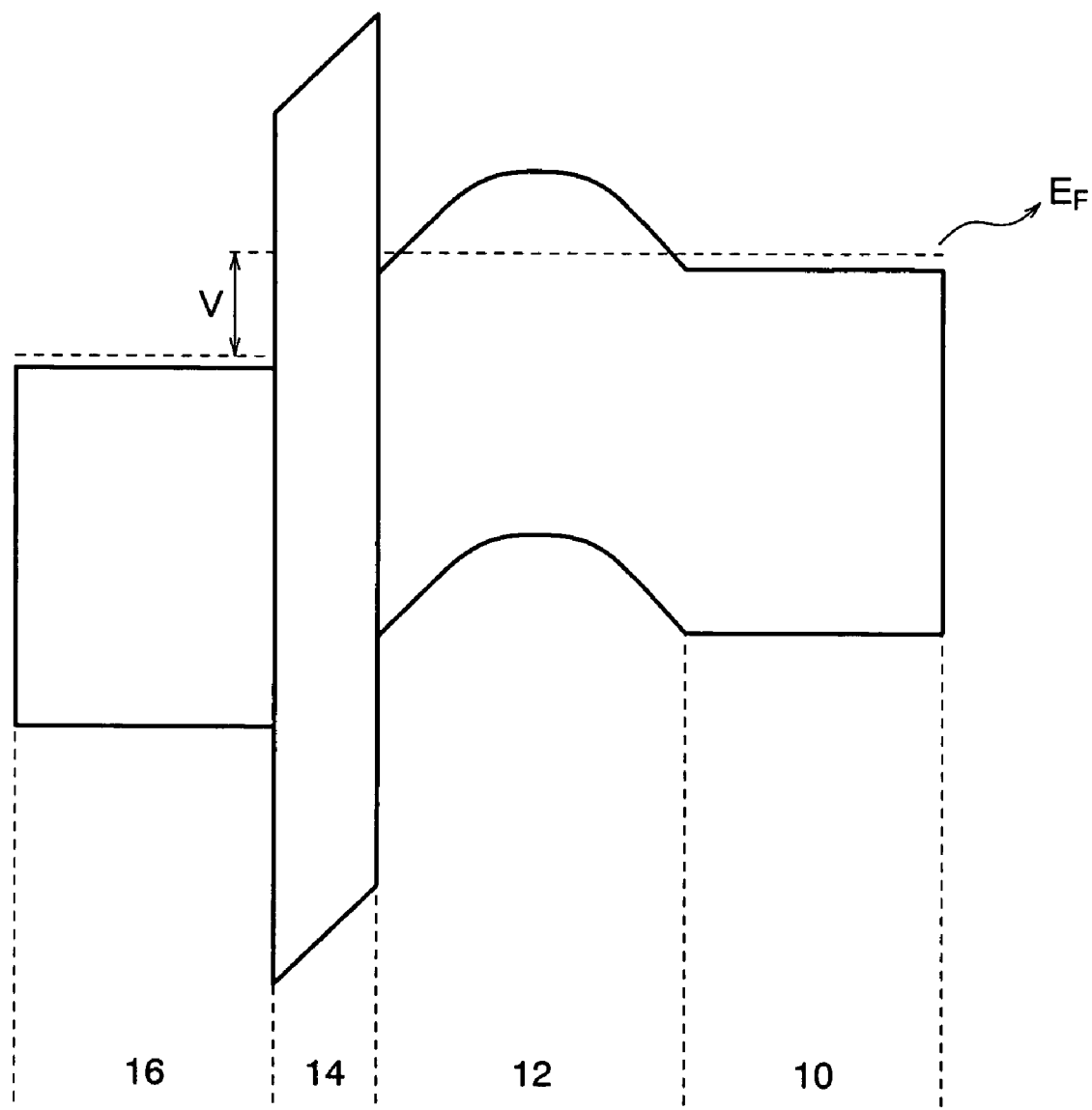
FIG. 4 is an energy band diagram of the ESD protection element according to the first embodiment at the time when a voltage equal to or lower than a protection voltage is applied.
Figure 5:
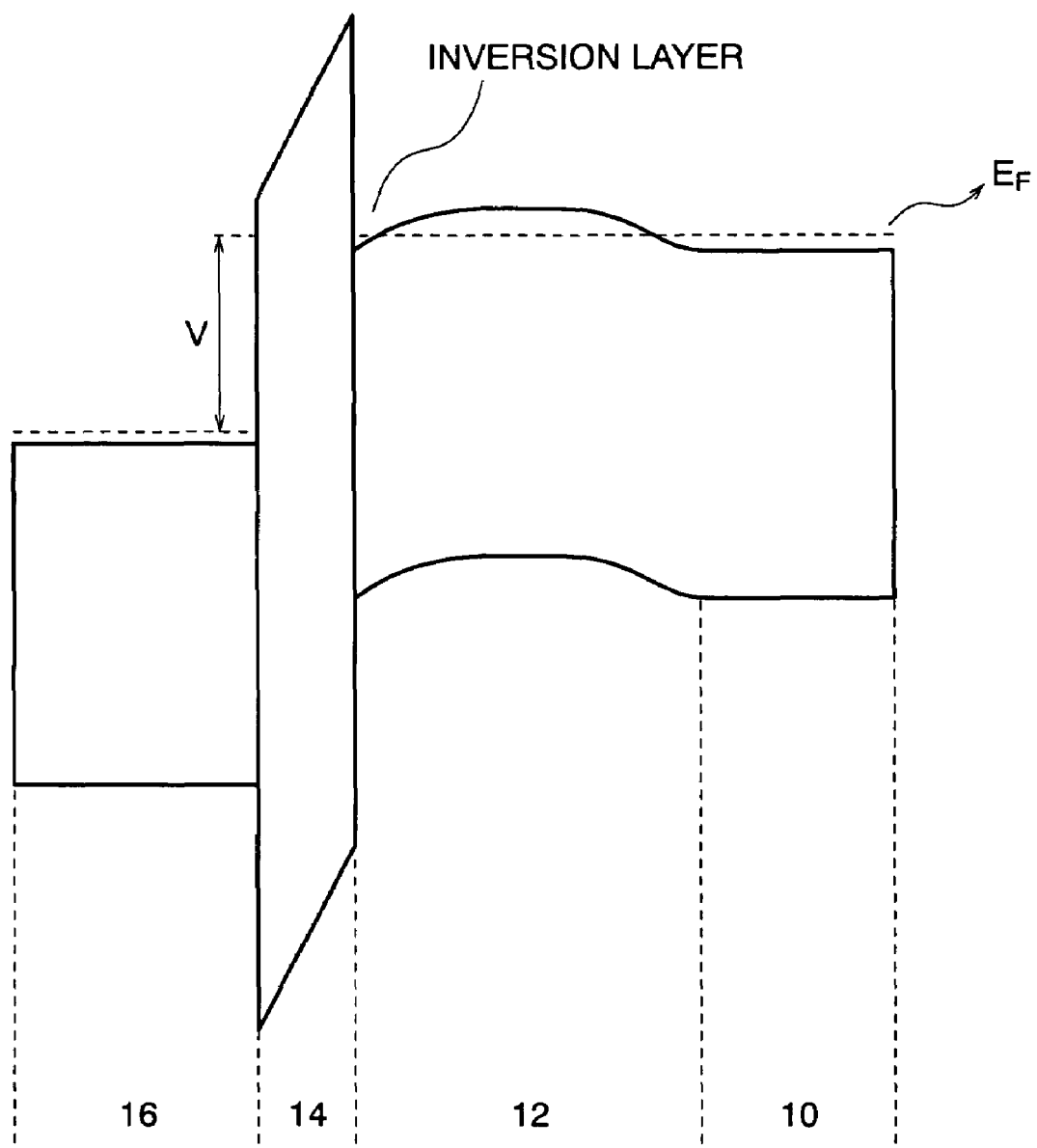
FIG. 5 is an energy band diagram of the ESD protection element according to the first embodiment at the time when a voltage higher than a protection voltage is applied.

The tunnel diode 1 according to the first embodiment having such a structure described above has current-voltage characteristics shown in FIG. 2. As shown in FIG. 2, in a case where a voltage equal to or lower than a protection voltage is applied to the $n^+$ silicon electrode 16, current hardly flows. On the other hand, in a case where a voltage higher than a protection voltage is applied to the $n^+$ silicon electrode 16, the resistance of the tunnel diode 1 drops suddenly so that a large current flows. The reason why the tunnel diode 1 according to the first embodiment exhibits such current-voltage characteristics shown in FIG. 2 can be explained using energy band diagrams shown in FIGS. 3 to 5. FIG. 3 is an energy band diagram of the tunnel diode 1 at the time when no bias is applied, that is, when no voltage is applied to the electrode 16. Further, as shown in FIG. 4, even when a voltage equal to or lower than a protection voltage is applied to the electrode 16, an electric field is mainly applied to a depletion layer (that is, to the $p^-$ silicon layer 12 provided below the insulating film 14) so that no current flows. However, as shown in FIG. 5, when the applied voltage is increased to exceed a protection voltage, an inversion layer is formed at the interface between the insulating film 14 and the $p^-$ silicon layer 12. As a result, an electric field is concentrated on the insulating film 14 so that a large tunnel current flows. It is to be noted that the mark "$E_F$" in FIGS. 3 to 5 represents the Fermi level.

A threshold value at which an inversion layer is formed in the tunnel diode, that is, a protection voltage is determined according to the properties of the electrode 16, the insulating film 14, the p⁻ silicon layer 12, and the n⁺ silicon layer 10. Specifically, the protection voltage can be controlled with good controllability by, for example, appropriately setting a film thickness or an impurity concentration.

Therefore, as the n⁺ silicon layer 10, the p⁻ silicon layer 12, the insulating film 14, and the n⁺ silicon electrode 16 which constitute the tunnel diode 1 according to the first embodiment, source/drain regions, a channel region, a gate insulating film, and a gate electrode each having substantially the same structure as that of an n-type channel transistor to be protected can be used, respectively. By doing so, the threshold value itself of the transistor can be used as a protection voltage. In general, the protection voltage of a transistor is higher than a threshold value. Therefore, by adjusting the threshold value of the tunnel diode so as to be higher than the threshold value of the transistor by a desired value, it is possible to obtain an ESD protection element having a desired protection voltage.

Figure 6:
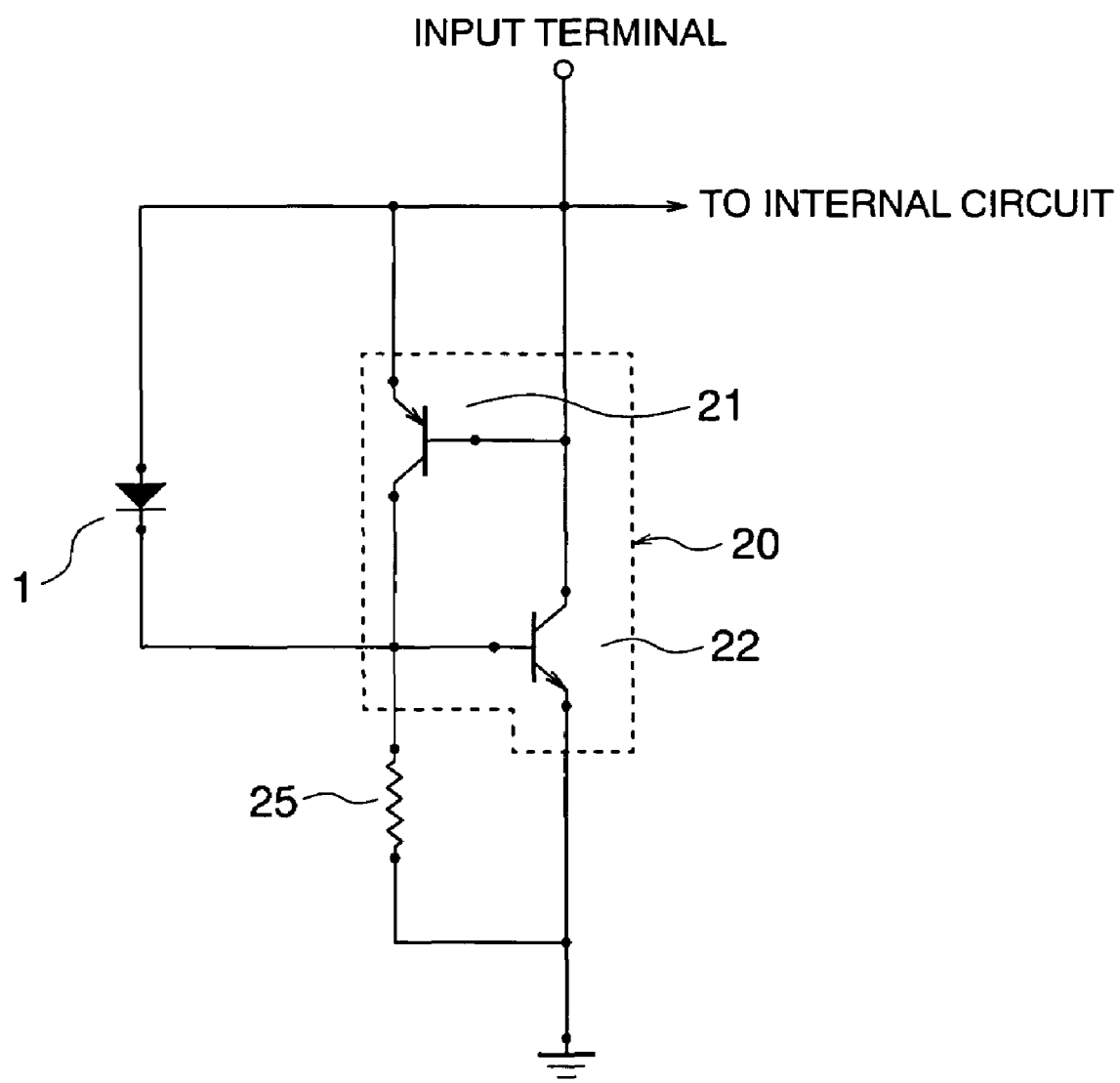
FIG. 6 is a circuit diagram of a semiconductor device using the ESD protection element according to the first embodiment.

As shown in FIG. 6, in a case where the tunnel diode 1 according to the first embodiment is used together with, for example, a thyristor 20 composed of a PNP transistor 21 and an NPN transistor 22, the thyristor 20 can exchange a signal with an internal circuit without problems while a normal voltage is applied to the electrode 16 of the tunnel diode 1, but when a voltage higher than a protection voltage is applied to the electrode 16, the tunnel diode 1 operates as an ESD protection element so that the applied voltage is quickly discharged to ground through a resistor 25.

As described above, according to the first embodiment, it is possible to easily set a protection voltage even when a semiconductor device to be protected includes a gate insulating film having a low dielectric breakdown voltage.

As described above, the ESD protection element according to the first embodiment can protect an n-type channel MOSFET. However, it is to be noted that by reversing the conductivity type of the n⁺ silicon layer 10, the p⁻ silicon layer 12, and the n⁺ silicon electrode 16, that is, by using a p⁺ silicon layer 10, an n⁻ silicon layer 12, and a P⁺ silicon electrode 16, it is possible to obtain an ESD protection element which can protect a p-type channel MOSFET.

Second Embodiment

Hereinbelow, an ESD protection element 2 according to a second embodiment of the present invention will be described with reference to FIG. 7. In the ESD protection element 2 according to the second embodiment, a p⁻-type semiconductor region 32 is provided in an element region of a semiconductor substrate 30 isolated by an element isolation region 31. On the p⁻-type semiconductor region 32, a gate insulating film 36 is provided. On the gate insulating film 36, a gate electrode 38 formed from an n⁺ impurity layer is provided. In the p⁻-type semiconductor region 32, n⁺ impurity regions 42 are provided. On the side faces of the gate electrode 38, a gate side wall 40 made of an insulating material is provided.

Figure 8:
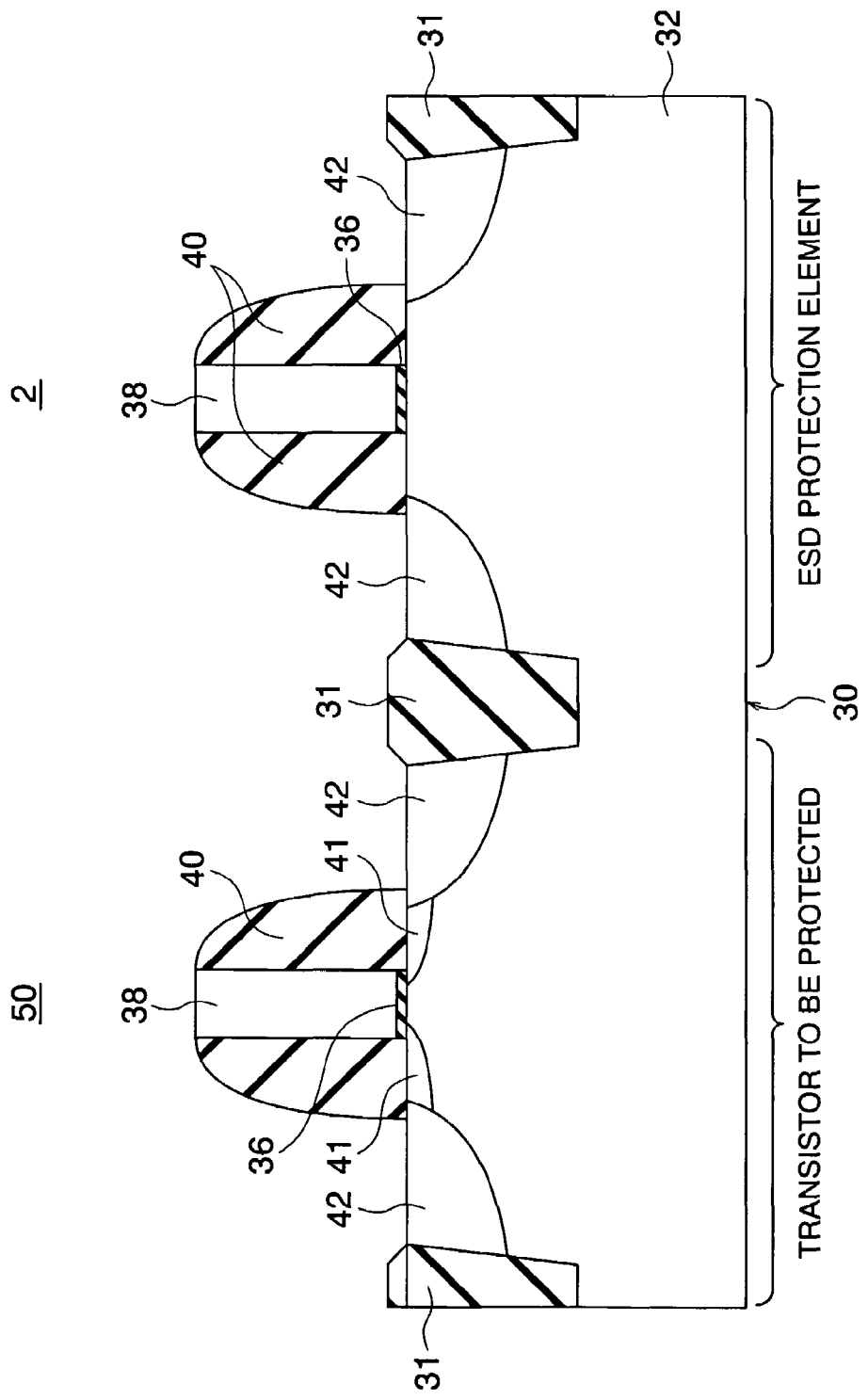
FIG. 8 is a cross-sectional view of the ESD protection element according to the second embodiment and a MOS transistor to be protected.

It may be considered that the n⁺ impurity layer 38, the insulating film 36, the p⁻ semiconductor region 32, and the n⁺ impurity regions 42 are stacked in this order in the ESD protection element according to the second embodiment when seen from the gate electrode 38 side, that is, the ESD protection element according to the second embodiment has the same structure as the tunnel diode according to the first embodiment shown in FIG. 1. In addition, as shown in FIG. 8, such a structure of the ESD protection element according to the second embodiment is substantially the same as that of a transistor 50 to be protected. Specifically, the transistor 50 to be protected includes a p⁻-type semiconductor region 32 provided in an element region of a semiconductor substrate 30 isolated by an element isolation region 31. On the p⁻-type semiconductor region 32, a gate insulating film 36 is provided. On the gate insulating film 36, a gate electrode 38 formed from an n⁺ impurity layer is provided. In the p⁻-type semiconductor region 32, extension layers 41 formed from an n⁺-type impurity layer and n⁺ impurity regions 42 are provided. On the side faces of the gate electrode 38, a gate side wall 40 made of an insulating material is provided. As described above, the structure of the transistor 50 to be protected is the same as that of the ESD protection element 2 according to the second embodiment except that the transistor 50 has the extension layers 41.

Therefore, the ESD protection element 2 and the transistor 50 to be protected can be manufactured using the same process. In addition, it is possible to allow the ESD protection element 2 and the transistor 50 to have the same impurity concentration and shape. This makes it very easy to adjust the protection voltage of the ESD protection element 2 to a value close to the threshold value of the transistor 50. In fact, it is necessary to set the protection voltage of the ESD protection element 2 to a value higher than the operating voltage of the transistor 50, and therefore the protection voltage of the ESD protection element 2 becomes slightly higher than the threshold value of the transistor 50. In order to set the protection voltage of the ESD protection element 2 to a value higher than the threshold value of the transistor 50, the n⁺ impurity regions 42 of the ESD protection element 2 according to the second embodiment are offset with respect to the gate electrode 38. That is, the n⁺ impurity regions 42 of the ESD protection element 2 according to the second embodiment do not extend to the p⁻-type semiconductor region 32 just below the gate electrode 38. In other words, the position of the joint surface between the n⁺ impurity region 42 and the p⁻-type semiconductor region 32 in the semiconductor substrate surface of the ESD protection element 2 is away from the side face of the gate electrode 38 on the outer side of the gate electrode 38.

On the other hand, in the transistor 50 to be protected, each of the n⁺ impurity regions 42 extends to the p⁻-type semiconductor region 32 just below the gate electrode 38 through the extension layer 41, that is, each of the extension layers 41 overlaps with the gate electrode 38 of the transistor 50 to be protected.

It is to be noted that the insulating film 36 of the ESD protection element 2 and the gate insulating film 36 of the MOS transistor 50 to be protected are formed at the same time, and therefore they have substantially the same thickness. Although not shown in the drawing, the gate electrode of the ESD protection element 2 and the gate electrode of the MOS transistor 50 to be protected are electrically connected to each other.

As described above, according to the second embodiment, it is possible to easily set a protection voltage even when a semiconductor device to be protected includes a gate insulating film having a low dielectric breakdown voltage.

Third Embodiment

Figure 9:
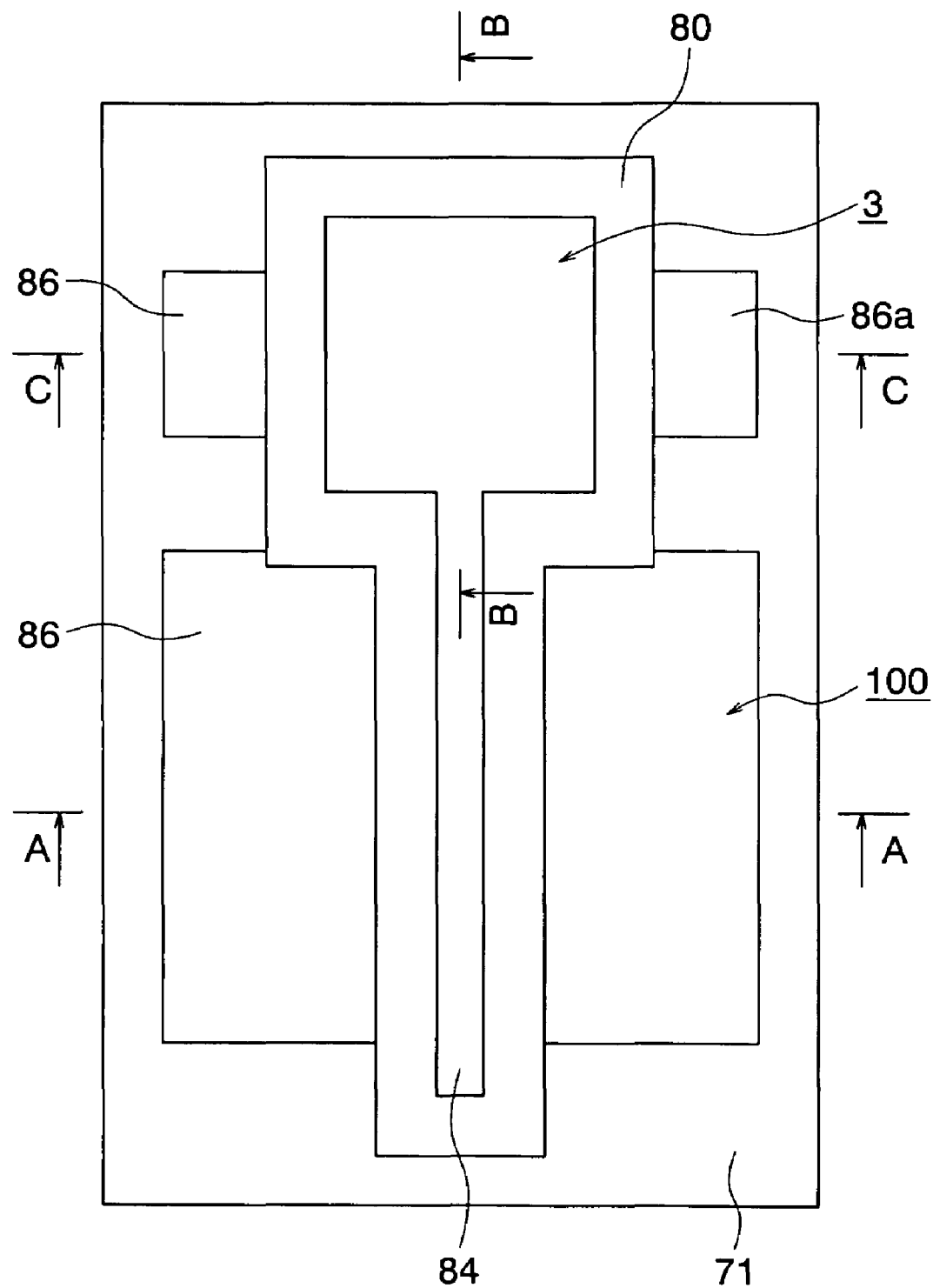
FIG. 9 is a plan view of an ESD protection element according to a third embodiment of the present invention.
Figure 10:
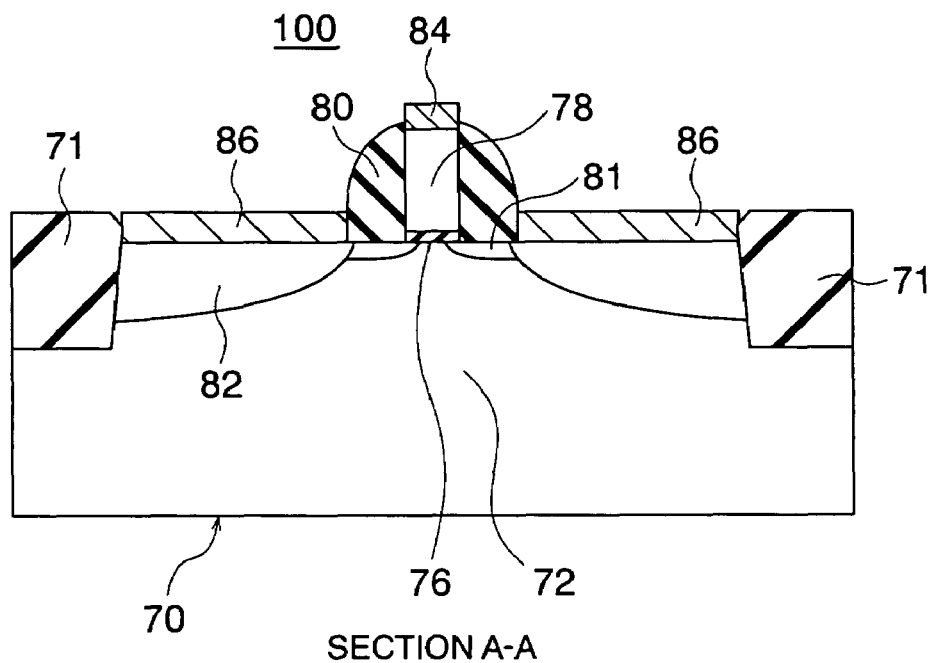
FIG. 10 is a cross-sectional view taken along the line A-A in FIG. 9.
Figure 11:
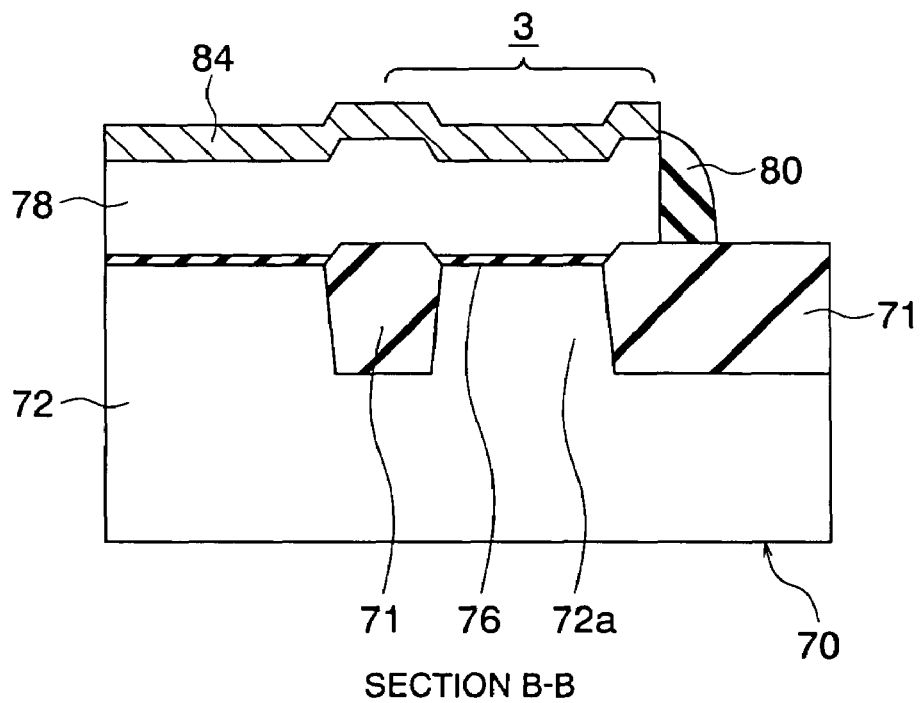
FIG. 11 is a cross-sectional view taken along the line B-B in FIG. 9.
Figure 12:
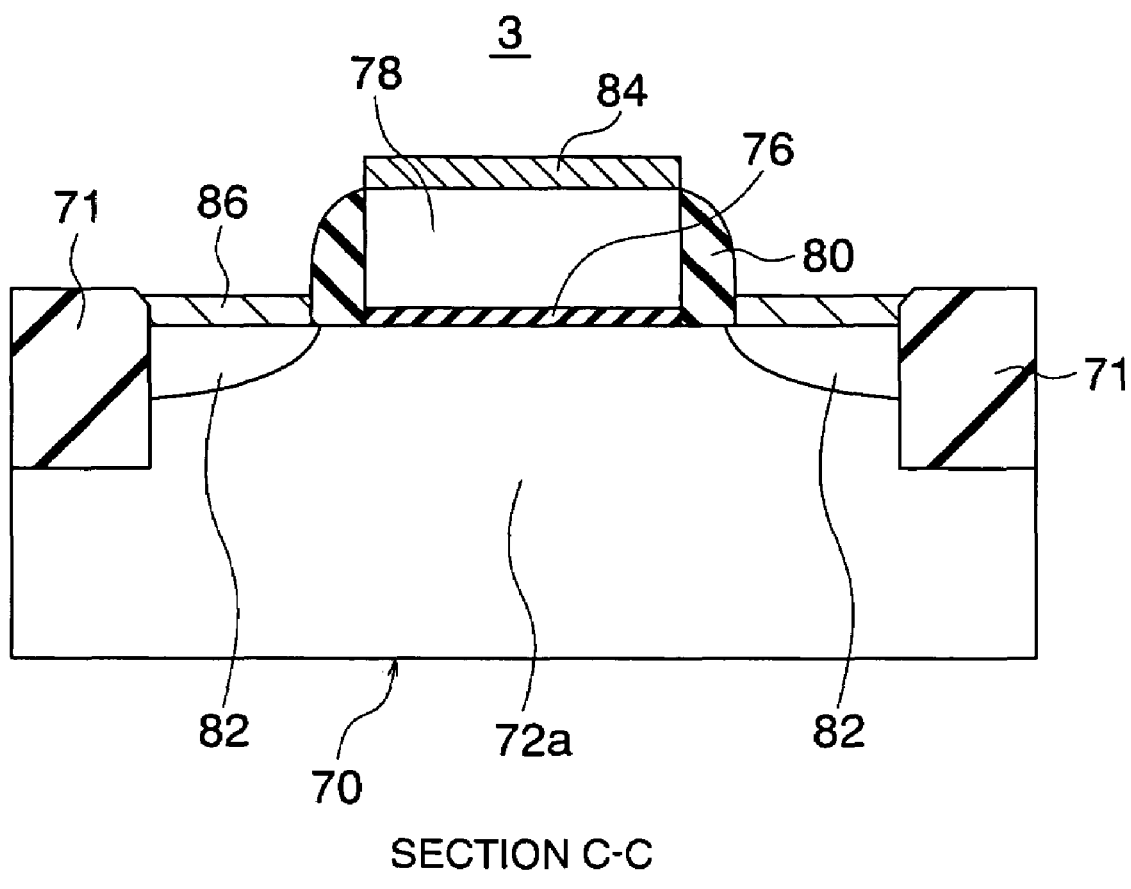
FIG. 12 is a cross-sectional view taken along the line C-C in FIG. 9.

Hereinbelow, an ESD protection element 3 according to a third embodiment of the present invention will be described with reference to FIGS. 9 to 12. FIG. 9 is a plan view of the ESD protection element 3 according to the third embodiment and a MOS transistor 100 to be protected, FIG. 10 is a cross-sectional view taken along the line A-A in FIG. 9, FIG. 11 is a cross-sectional view taken along the line B-B in FIG. 9, and FIG. 12 is a cross-sectional view taken along the line C-C in FIG. 9.

The ESD protection element 3 according to the third embodiment is provided on a substrate 70 on which the MOS transistor 100 to be protected is also provided so as to be adjacent to the ESD protection element 3. The MOS transistor 100 to be protected includes a p-type well region 72 electrically isolated by an element isolation region 71 and provided on the silicon substrate 70. On the p-type well region 72, an insulating film 76 is provided. On the insulating film 76, a gate electrode 78 formed of $n^+$-type silicon is provided. On the side faces of the gate electrode 78, a gate side wall 80 made of an insulating material is provided. In the p-type well region 72, $n^+$ source/drain regions 82 are provided. Between a channel region just below the gate electrode 78 and the $n^+$ source/drain regions 82, $n^+$ extension layers 81 are provided (see FIG. 10). On the gate electrode 78, a silicide layer 84 is provided. On the $n^+$ source/drain regions 82, a silicide layer 86 is provided.

On the other hand, the ESD protection element 3 is provided on a p-type well region 72a isolated by the element isolation region 71. On the p-type well region 72a, an insulating film 76 is provided. On the insulating film 76, a gate electrode 78 formed of $n^+$-type silicon is provided. On the side faces of the gate electrode, a gate side wall 80 made of an insulating material is provided. In the p-type well region 72a, $n^+$ source/drain regions 82 are provided. On the gate electrode 78, a silicide layer 84 is provided. On the $n^+$ source/drain regions 82, a silicide layer 86 is provided. It is to be noted that the ESD protection element 3 is different from the MOS transistor 100 in that the ESD protection element 3 does not have the $n^+$ extension layers 81 (see FIG. 12). Further, the insulating film 76 of the ESD protection element 3 and the gate insulating film 76 of the MOS transistor 100 to be protected are formed at the same time, and therefore they have substantially the same thickness. Furthermore, the gate width of the gate electrode 78 of the ESD protection element 3 according to the third embodiment is larger than that of the gate electrode 78 of the MOS transistor 100 to be protected.

The gate electrode 78 of the ESD protection element 3 according to the third embodiment is integral with the gate electrode 78 of the MOS transistor 100 so that they are connected to each other. The gate electrode 78 and the silicide layer 84 of the ESD protection element 3 provide a pad region for connection with a wiring layer. Usually, a pad region is provided on an element isolation region, but in the third embodiment, the gate electrode 78 and the suicide layer 84 of the ESD protection element 3 provide a pad region.

Figure 7:
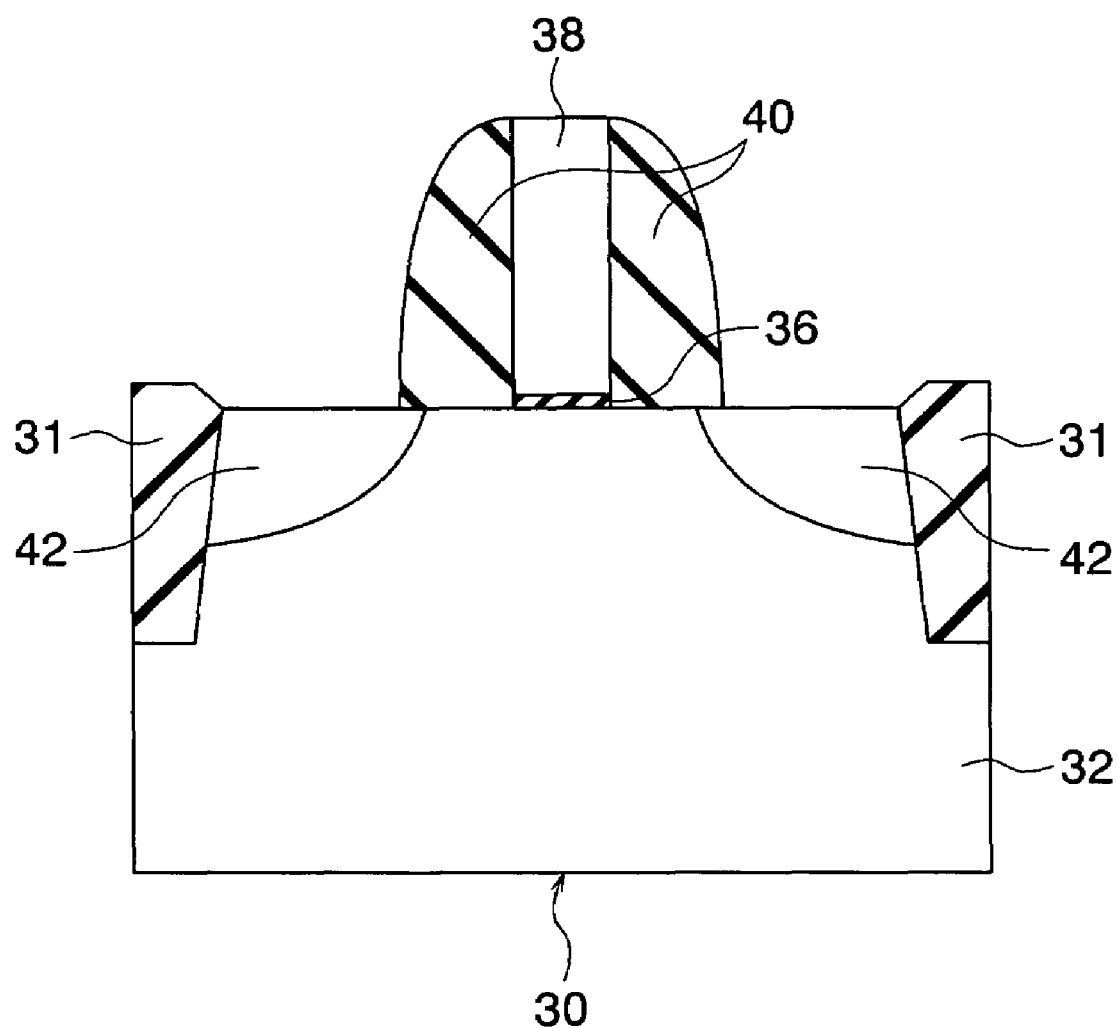
FIG. 7 is a cross-sectional view of an ESD protection element according to a second embodiment of the present invention.

As in the case of the ESD protection element according to the second embodiment shown in FIG. 7, the ESD protection element 3 according to the third embodiment is a tunnel diode, and protects the insulating film 76 of the n-type MOS-FET 100 connected to the ESD protection element 3 through the gate electrode 78 from ESD breakdown.

As described above, as in the case of the second embodiment, the third embodiment also makes it possible to easily set a protection voltage even when a semiconductor device to be protected includes a gate insulating film having a low dielectric breakdown voltage.

Fourth Embodiment

Hereinbelow, a method for manufacturing an ESD protection element according to a fourth embodiment of the present invention will be described with reference to FIGS. 13A to 17B. The manufacturing method according to the fourth embodiment is a method for manufacturing the ESD protection element according to the second embodiment shown in FIG. 7.

Figure 13A:
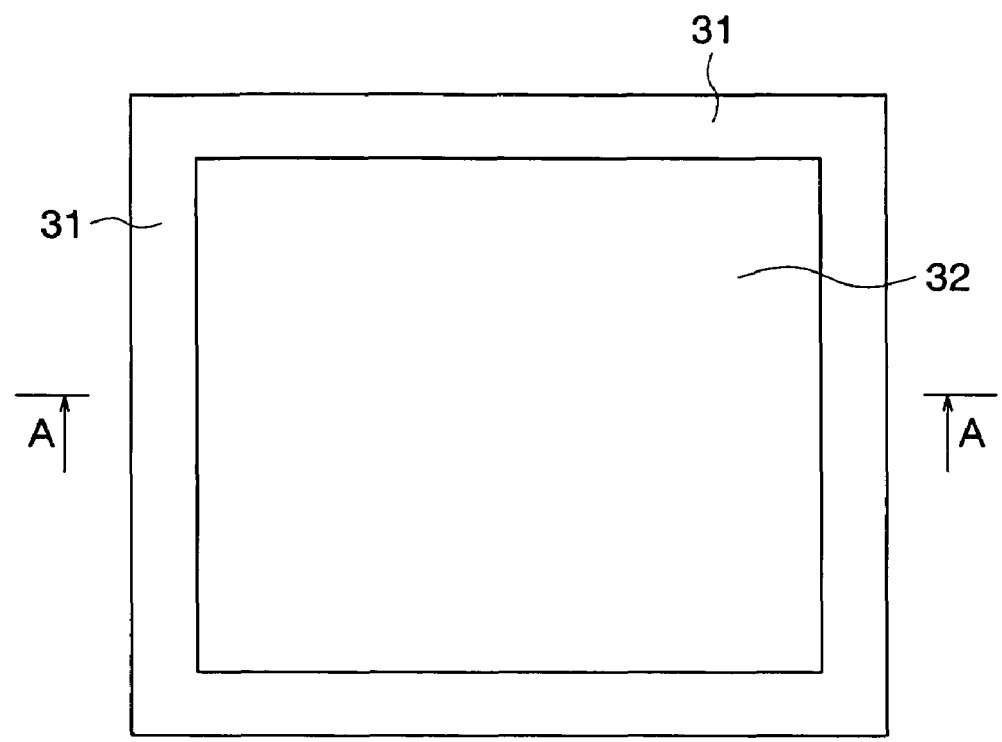
FIG. 13A is a plan view for illustrating a step of a method for manufacturing an ESD protection element according to a fourth embodiment of the present invention.
Figure 13B:
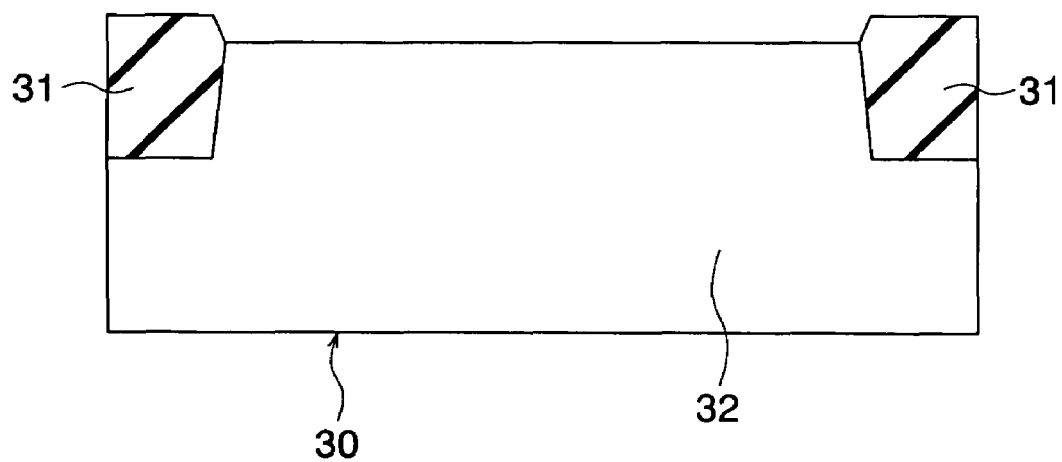
FIG. 13B is a cross-sectional view taken along the line A-A in FIG. 13A.
Figure 14A:
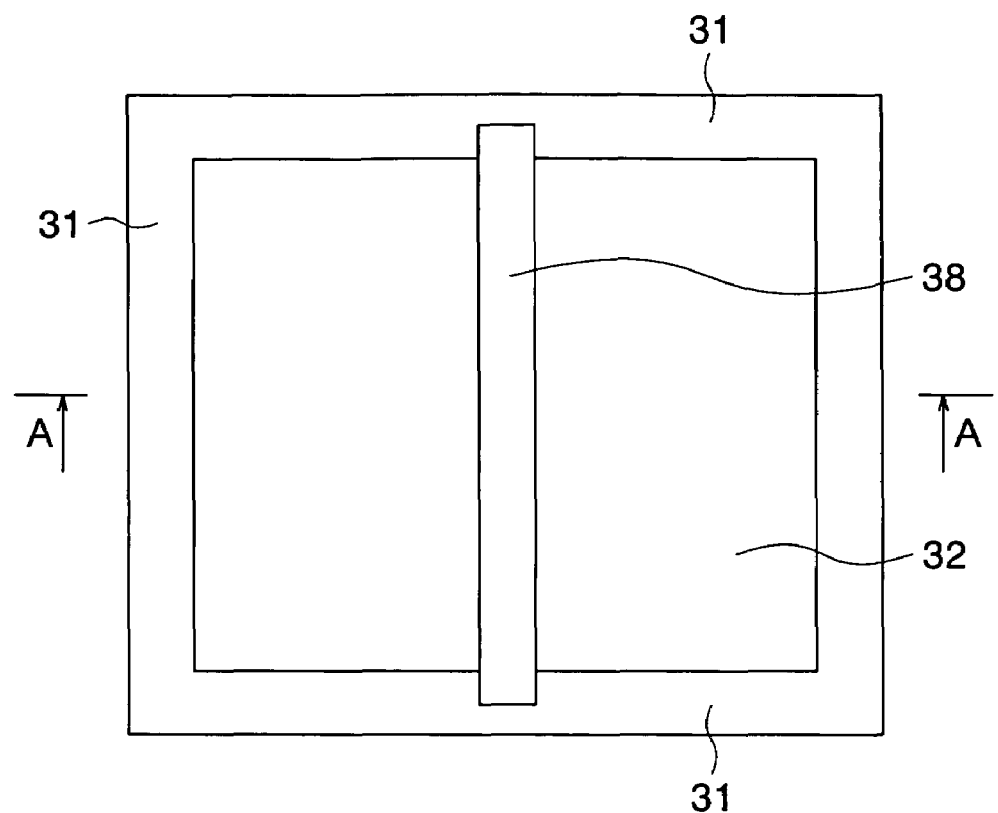
FIG. 14A is a plan view for illustrating a step of a method for manufacturing an ESD protection element according to the fourth embodiment of the present invention.
Figure 14B:
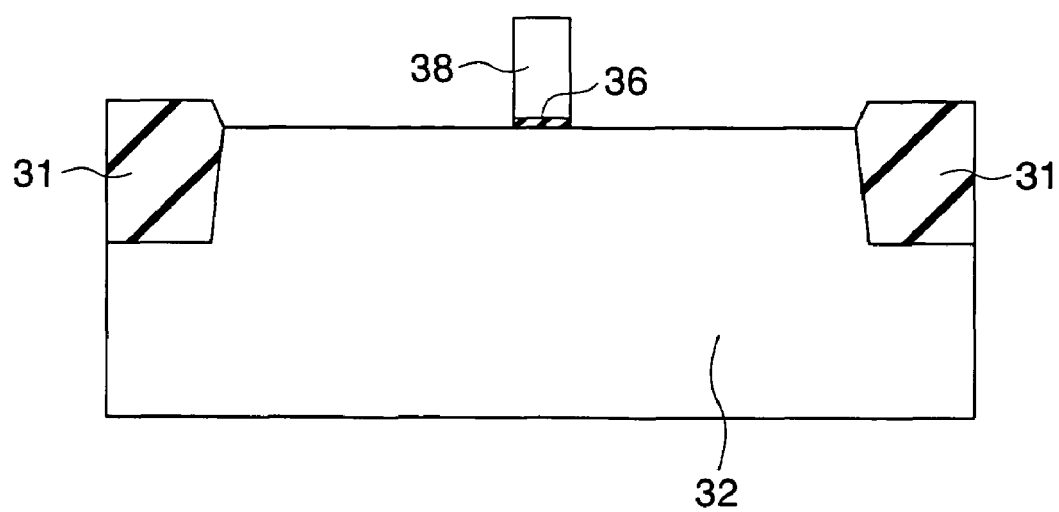
FIG. 14B is a cross-sectional view taken along the line A-A in FIG. 14A.

First, as shown in FIGS. 13A and 13B, the element isolation region 31 is formed on the silicon substrate 30 having the $p^-$-type semiconductor region 32 so as to surround an element region for forming the ESD protection element. Thereafter, an insulating film is formed on the element region so as to have an equivalent oxide thickness (hereinafter, also referred to as "EOT") of about 1 nm, and then a polysilicon film is deposited so as to have a thickness of about 100 to 150 nm. The thus formed polysilicon film and insulating film are patterned by, for example, lithography and RIE (Reactive Ion Etching) to thereby form the gate electrode 38 and the gate insulating film 36 (see FIGS. 14A and 14B). Here, post oxidation is carried out so that about 1 to 2 nm of the gate electrode 38 is oxidized, if necessary.

Figure 15A:
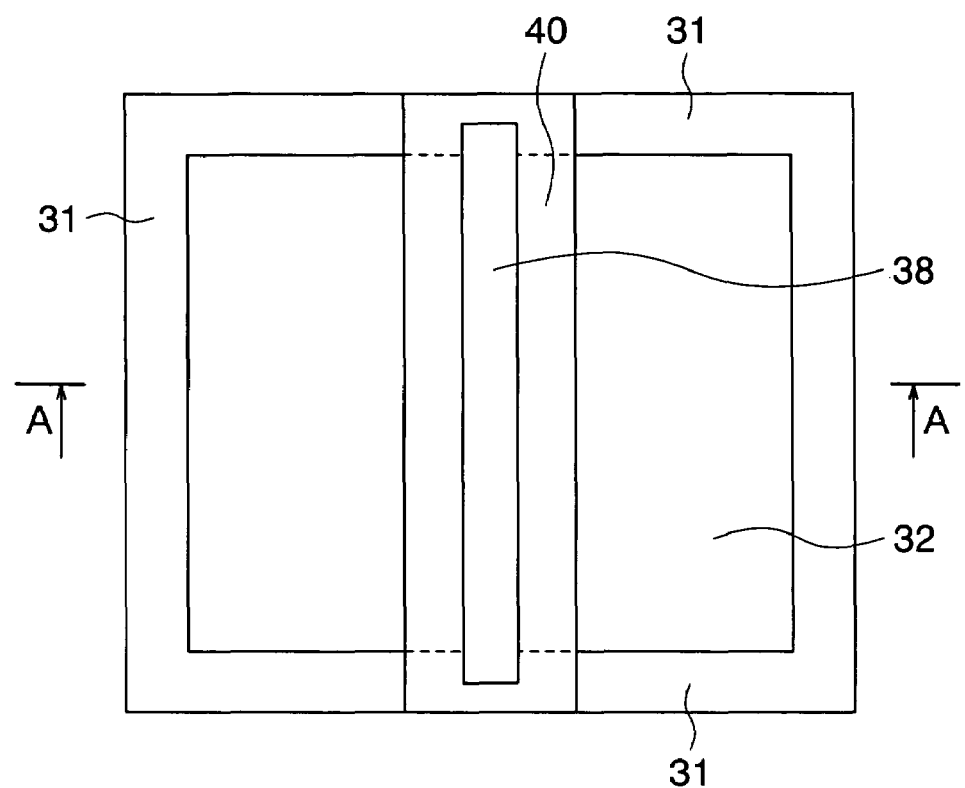
FIG. 15A is a plan view for illustrating a step of a method for manufacturing an ESD protection element according to the fourth embodiment of the present invention.
Figure 15B:
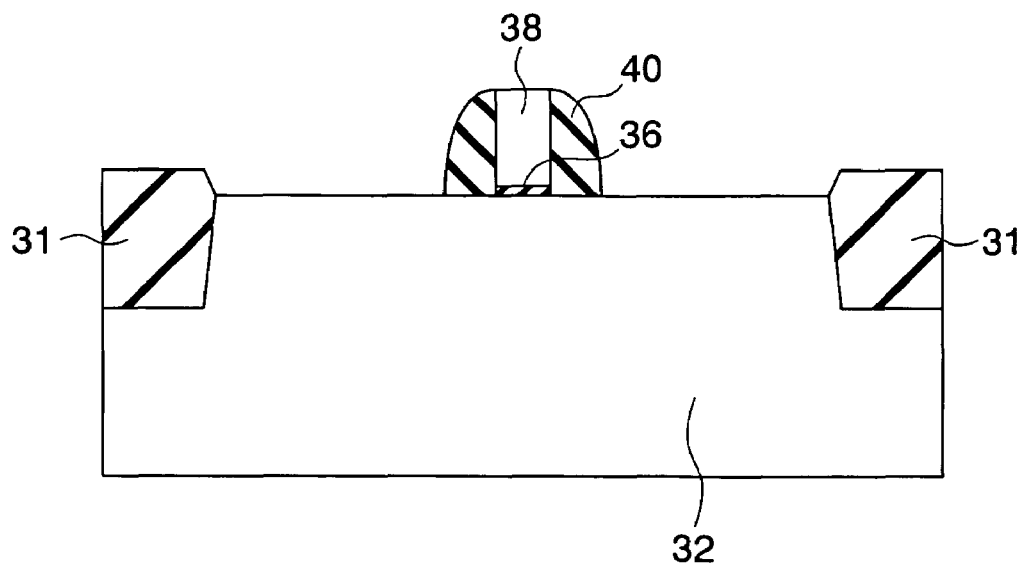
FIG. 15B is a cross-sectional view taken along the line A-A in FIG. 15A.

Next, as shown in FIGS. 15A and 15B, a TEOS film is deposited by low-pressure chemical vapor deposition (LP-CVD) so as to have a thickness of about 30 nm, and is then etched back by RIE to form the gate side wall 40.

Figure 16A:
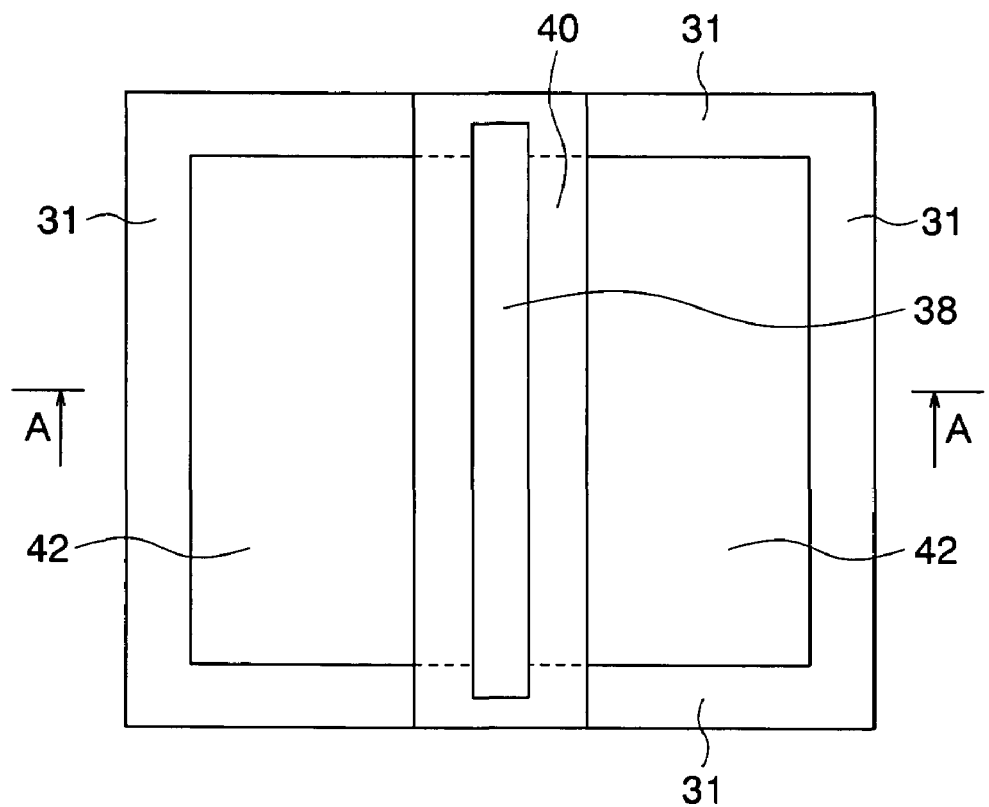
FIG. 16A is a plan view for illustrating a step of a method for manufacturing an ESD protection element according to the fourth embodiment of the present invention.
Figure 16B:
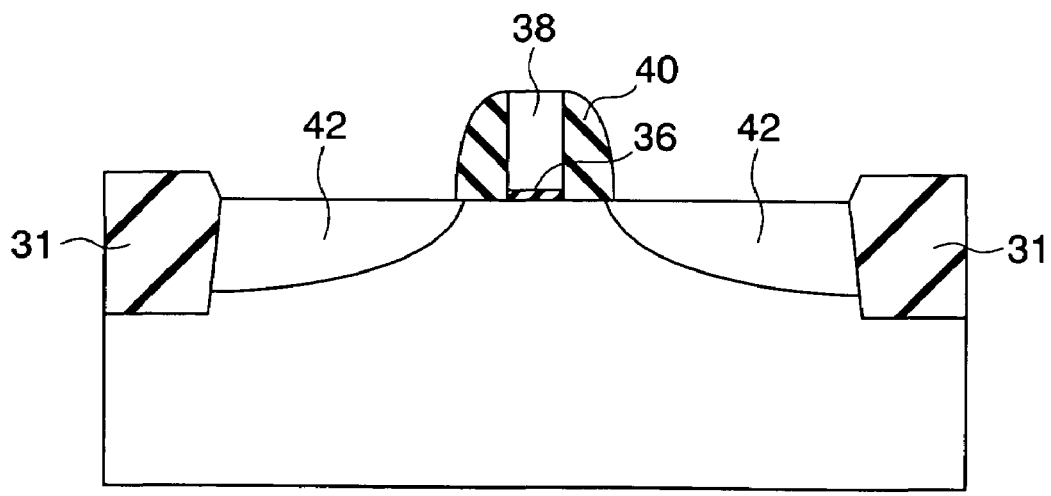
FIG. 16B is a cross-sectional view taken along the line A-A in FIG. 16A.

Next, as shown in FIGS. 16A and 16B, As ions are implanted into the $p^-$-type semiconductor region 32 at an accelerating voltage of 30 keV and a dosage of $2 \times 10^{15}$ cm$^{-2}$ to form the $n^+$ impurity regions 42.

Figure 17A:
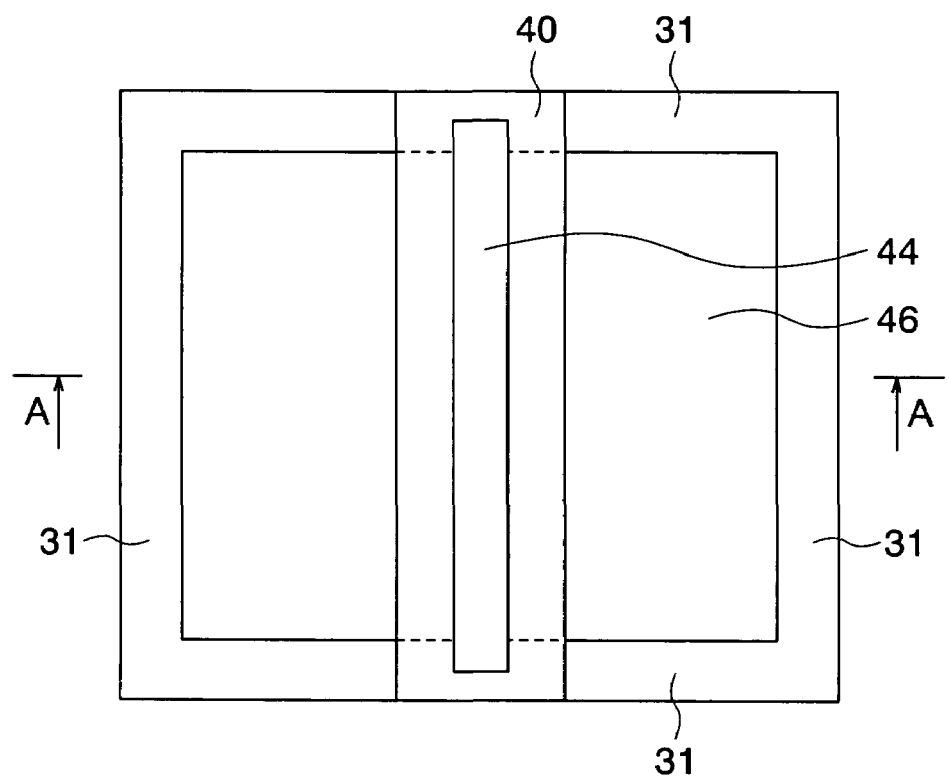
FIG. 17A is a plan view for illustrating a step of a method for manufacturing an ESD protection element according to the fourth embodiment of the present invention.
Figure 17B:
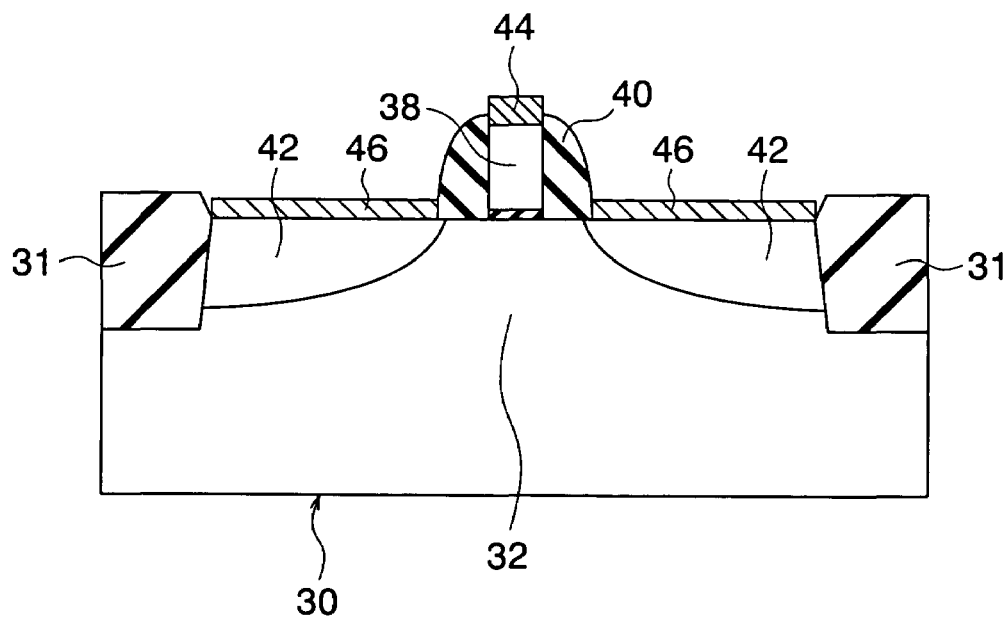
FIG. 17B is a cross-sectional view taken along the line A-A in FIG. 17A.

Next, as shown in FIGS. 17A and 17B, Ni is sputtered to form an Ni film of about 90 Å, and then heat treatment is carried out at 500° C. for about 30 seconds. Thereafter, unreacted Ni is removed to form the suicide layers 44 and 46 on the gate electrode 38 and the $n^+$ impurity regions 42, respectively, to thereby obtain an ESD protection element according to the second embodiment.

As in the case of the ESD protection element according to the second embodiment, the ESD protection element manufactured by the method according to the fourth embodiment can also easily set a protection voltage even when a semiconductor device to be protected includes a gate insulating film having a low dielectric breakdown voltage.

Fifth Embodiment

Hereinbelow, a method for manufacturing an ESD protection element according to a fifth embodiment of the present invention will be described with reference to FIGS. 18 to 35. The manufacturing method according to the fifth embodiment is a method for manufacturing the ESD protection element according to the third embodiment shown in FIG. 9.

Figure 18:
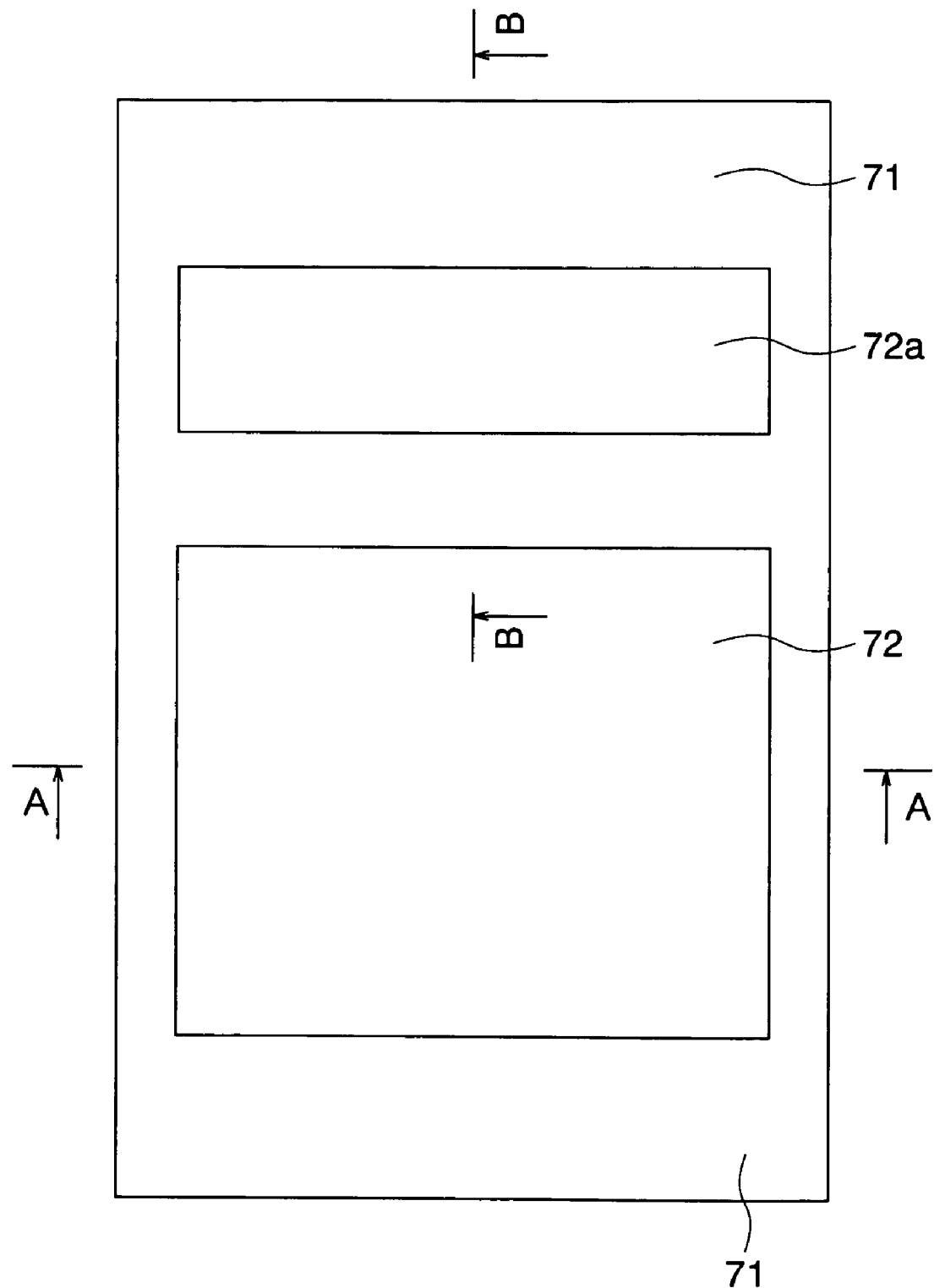
FIG. 18 is a plan view for illustrating a step of a method for manufacturing an ESD protection element according to a fifth embodiment of the present invention.
Figure 19:
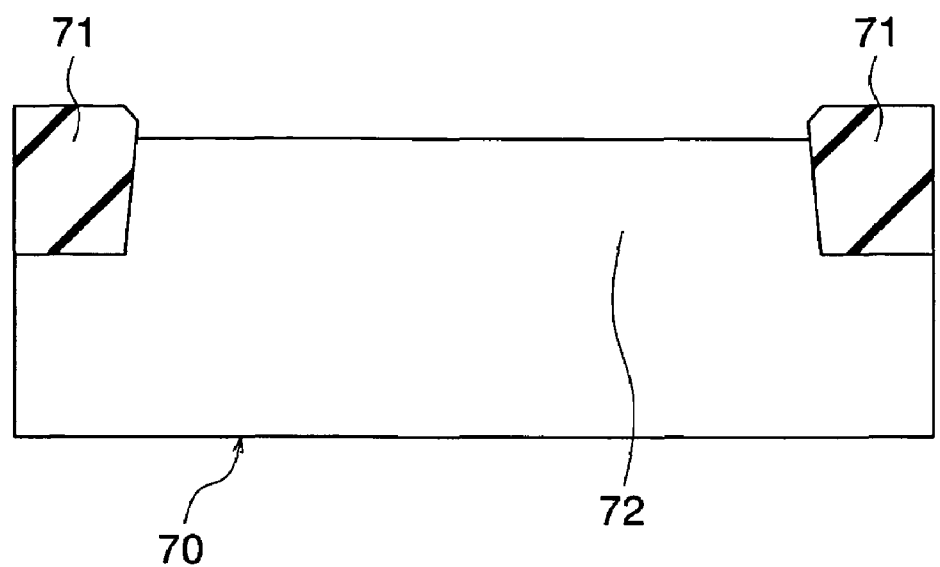
FIG. 19 is a cross-sectional view taken along the line A-A in FIG. 18.
Figure 20:
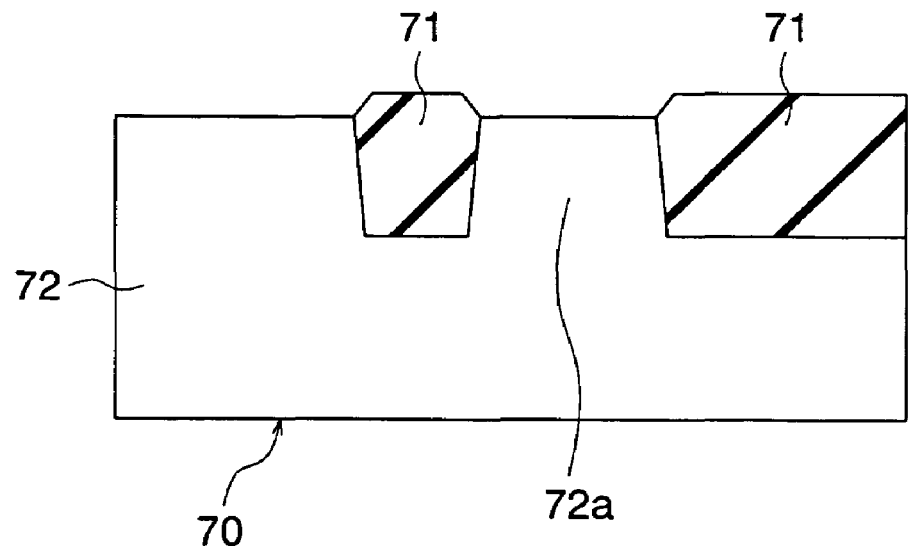
FIG. 20 is a cross-sectional view taken along the line B-B in FIG. 18.

First, as shown in FIGS. 18 to 20, the element isolation region 71 is formed on the silicon substrate 70 having a p-type well region to isolate the p-type well regions 72 and 72a from each other. FIG. 18 is a plan view for illustrating a step of the manufacturing method according to the fifth embodiment, FIG. 19 is a cross-sectional view taken along the line A-A in FIG. 18, and FIG. 20 is a cross-sectional view taken along the line B-B in FIG. 18.

Figure 21:
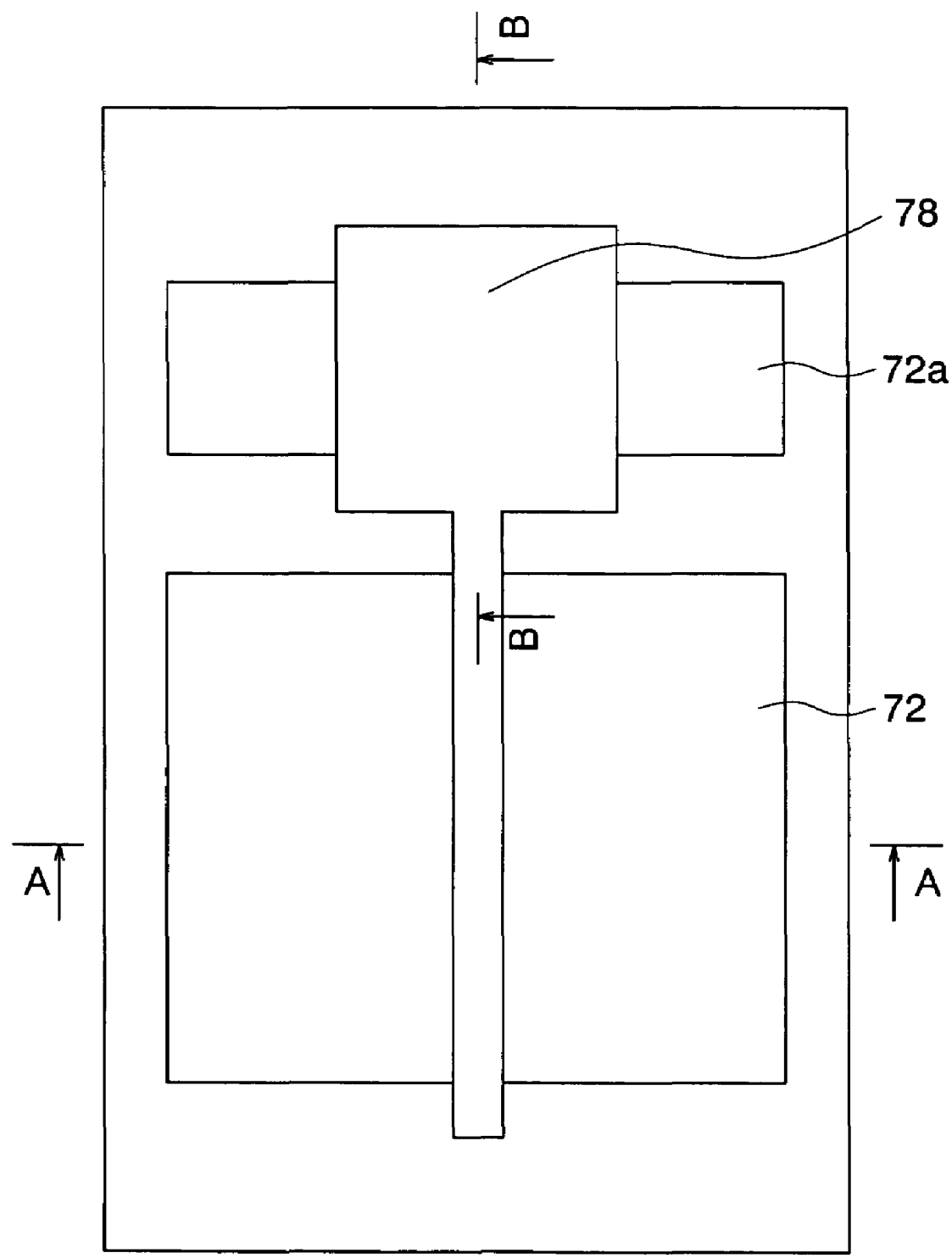
FIG. 21 is a plan view for illustrating a step of a method for manufacturing an ESD protection element according to the fifth embodiment of the present invention.
Figure 22:
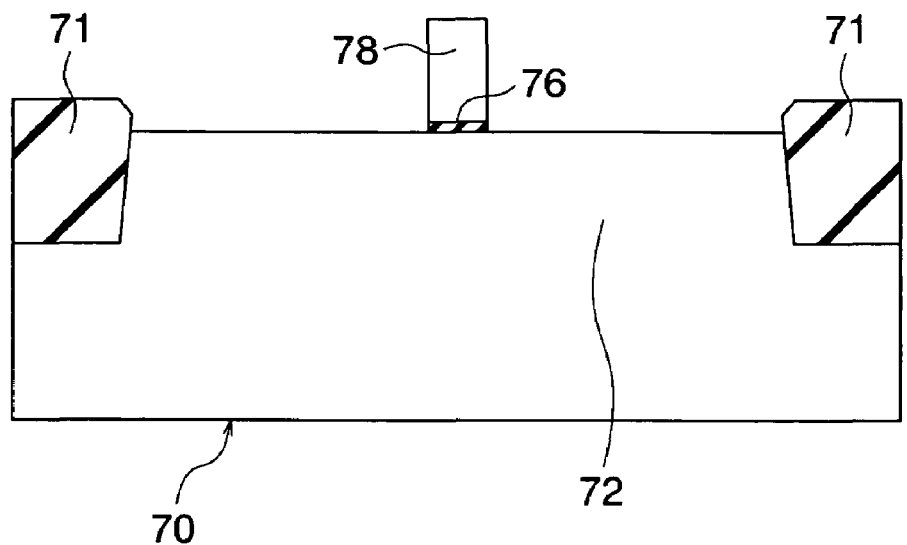
FIG. 22 is a cross-sectional view taken along the line A-A in FIG. 21.
Figure 23:
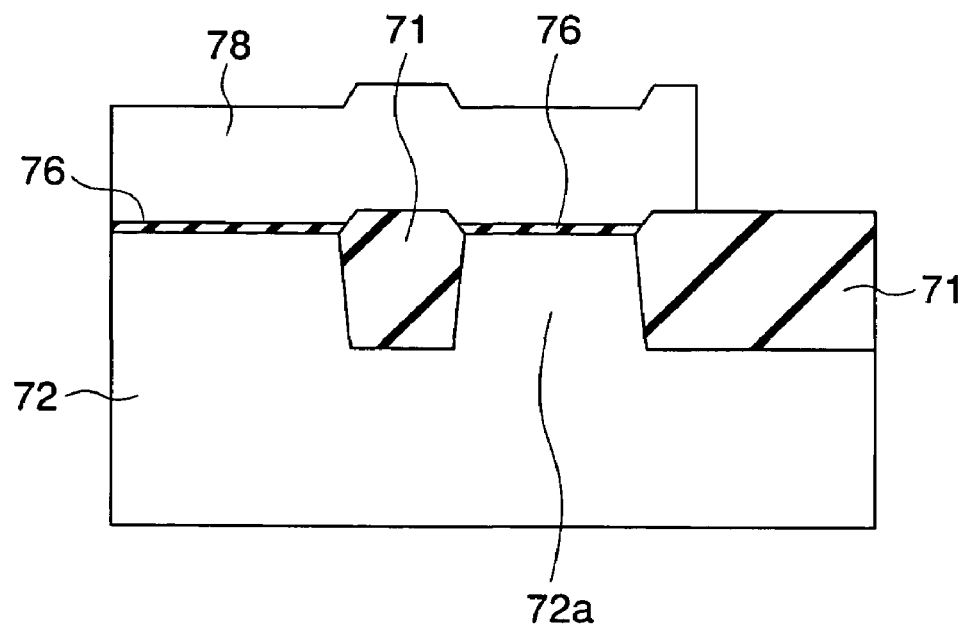
FIG. 23 is a cross-sectional view taken along the line B-B in FIG. 21.

Next, as shown in FIGS. 21 to 23, an insulating film is formed so as to have an EOT of about 1 nm, and then a polysilicon film is deposited so as to have a thickness of about 100 to 150 nm. Thereafter, the insulating film and the polysilicon film are patterned by for example, lithography and RIE to form the gate insulating film 76 and the gate electrode 78. Here, post oxidation is carried out so that about 1 to 2 nm of the gate electrode 38 is oxidized, if necessary. It is to be noted that FIG. 21 is a plan view for illustrating a step of the manufacturing method according to the fifth embodiment, FIG. 22 is a cross-sectional view taken along the line A-A in FIG. 21, and FIG. 23 is a cross-sectional view taken along the line B-B in FIG. 21.

Figure 24:
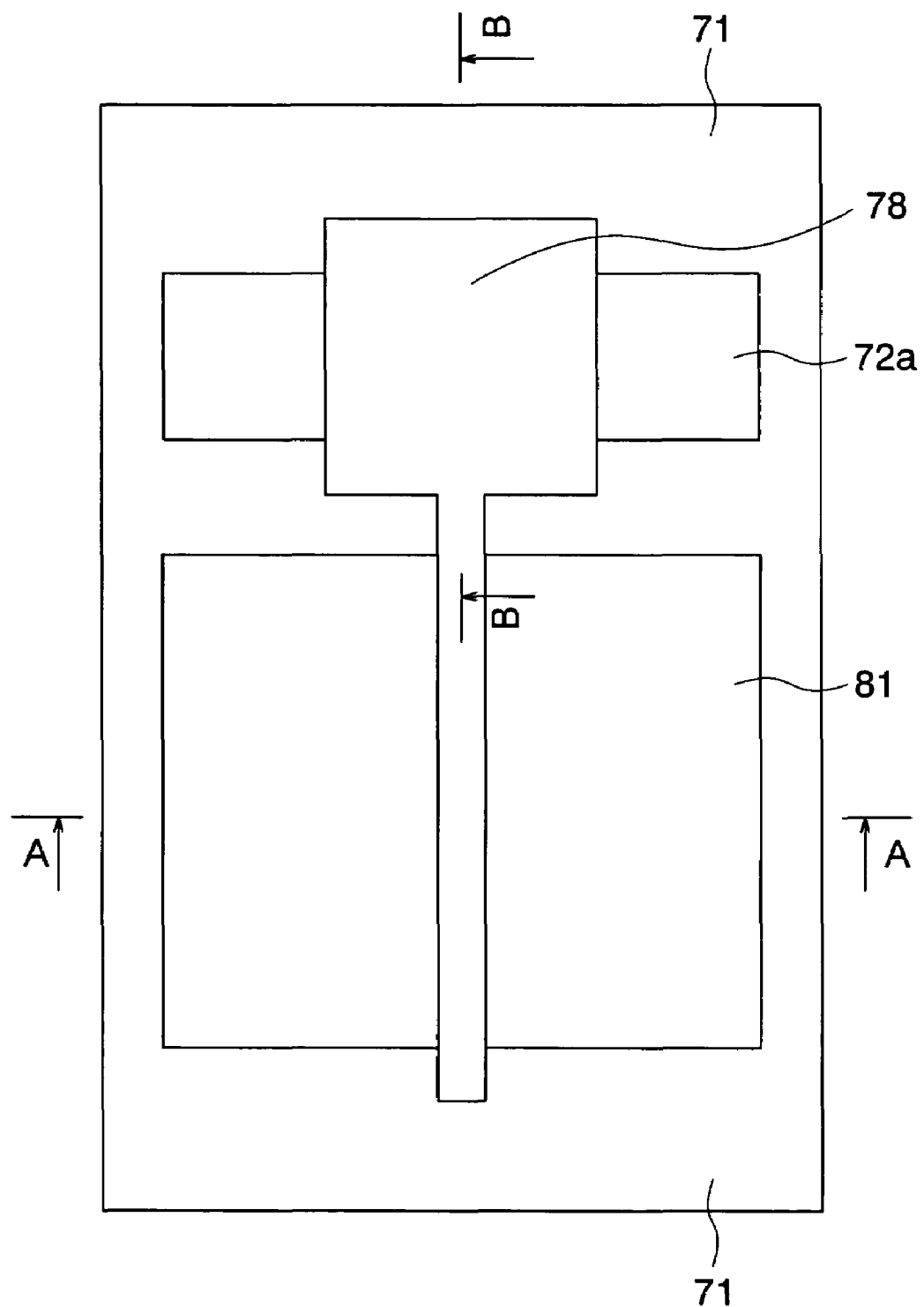
FIG. 24 is a plan view for illustrating a step of a method for manufacturing an ESD protection element according to the fifth embodiment of the present invention.
Figure 25:
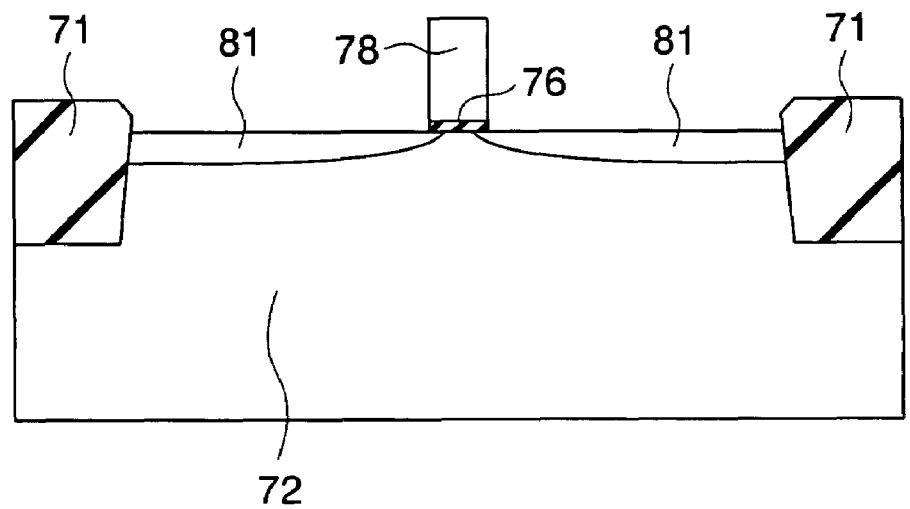
FIG. 25 is a cross-sectional view taken along the line A-A in FIG. 24.
Figure 26:
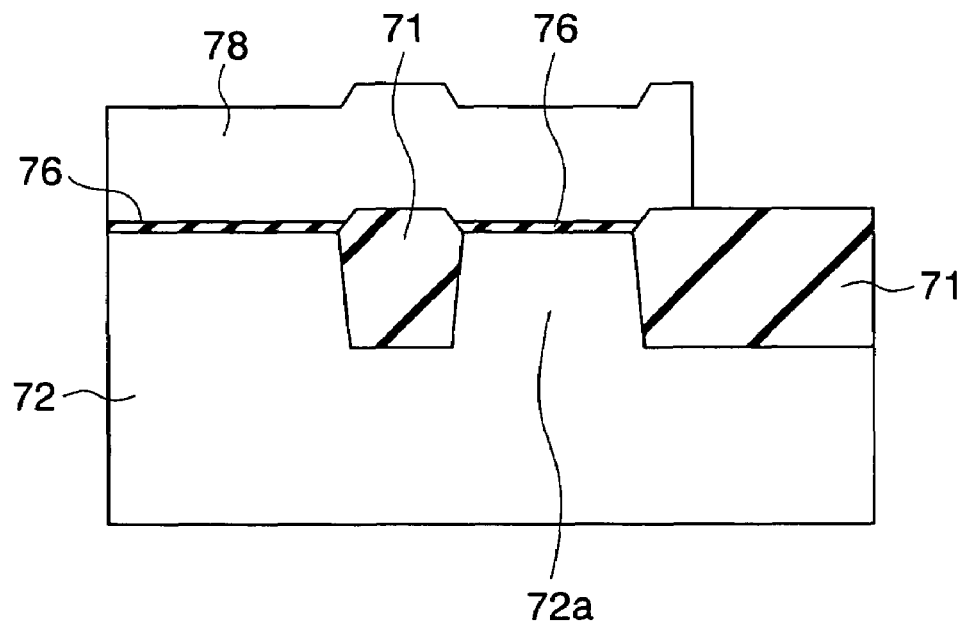
FIG. 26 is a cross-sectional view taken along the line B-B in FIG. 24.

Next, as shown in FIGS. 24 to 26, As ions are implanted into the p-type well region 72 at an accelerating voltage of 1 keV and a dosage of $2\times10^{14}$ cm$^{-2}$, and then anneling is carried out for activation to form the extension regions 81 in only the p-type well region 72. Since the p-type well region 72a is covered with a mask (not shown), an extension region is not formed in the p-type well region 72a. After the extension regions 81 are formed, the mask is removed. Here, an offset spacer or a halo region may be formed. It is to be noted that FIG. 24 is a plan view for illustrating a step of the manufacturing method according to the fifth embodiment, FIG. 25 is a cross-sectional view taken along the line A-A in FIG. 24, and FIG. 26 is a cross-sectional view taken along the line B-B in FIG. 24.

Figure 27:
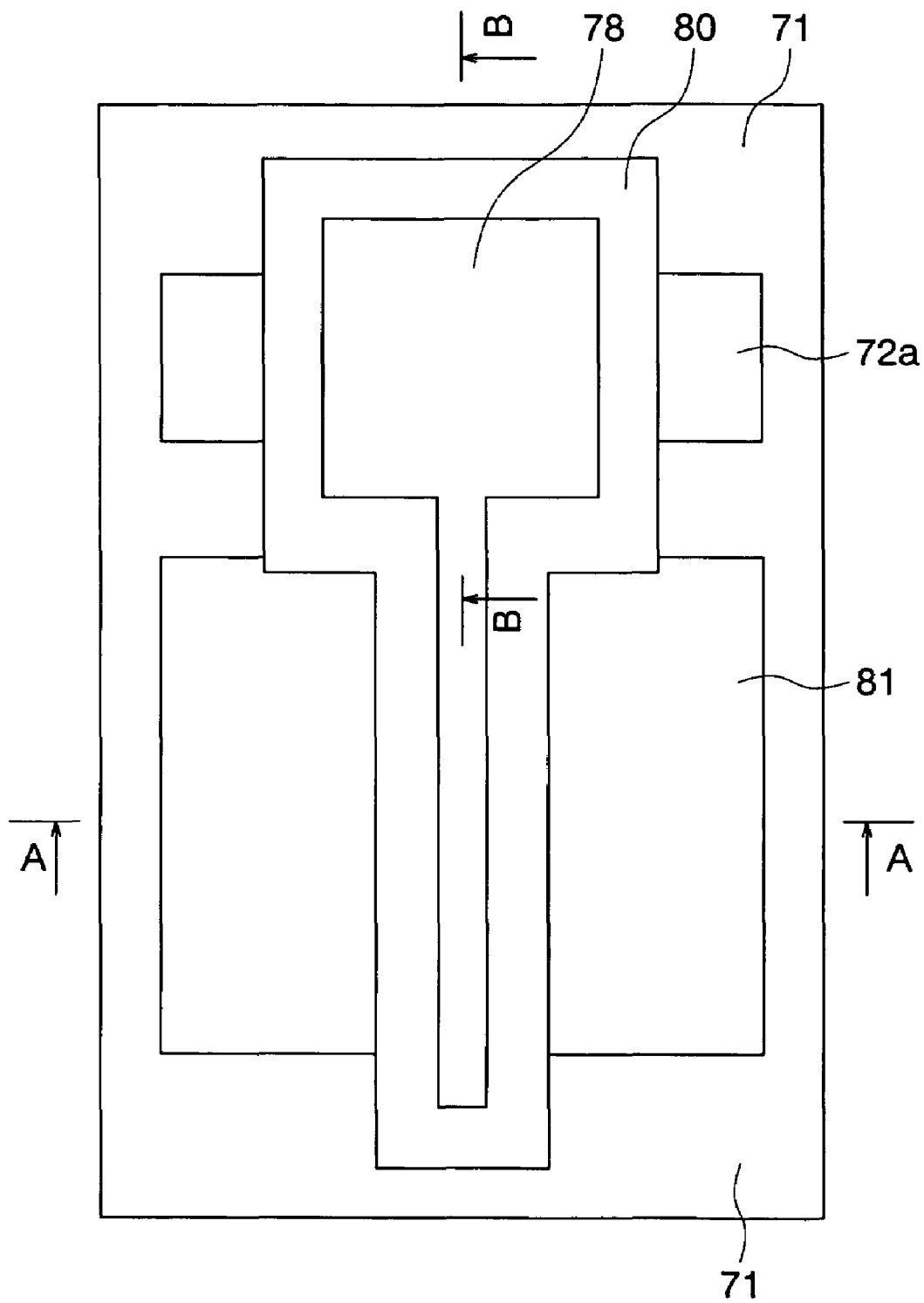
FIG. 27 is a plan view for illustrating a step of a method for manufacturing an ESD protection element according to the fifth embodiment of the present invention.
Figure 28:
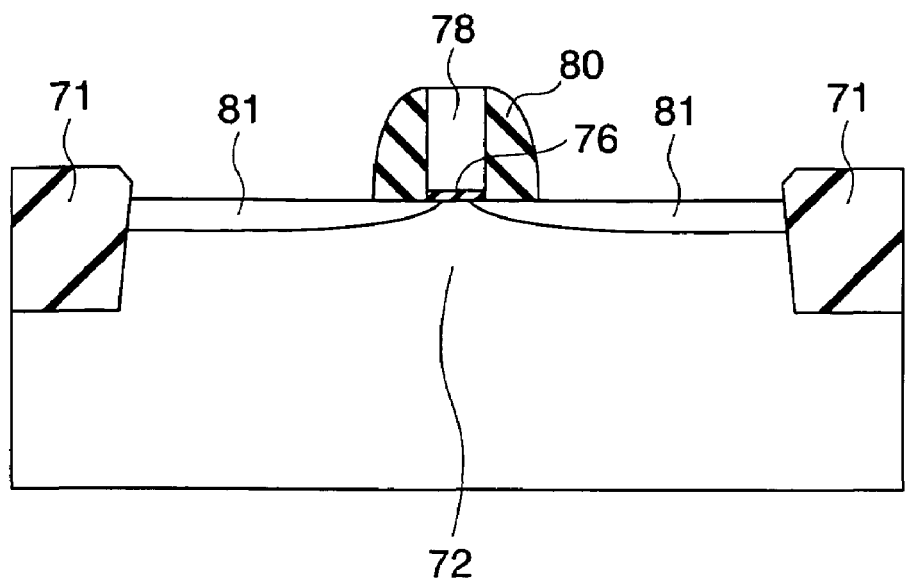
FIG. 28 is a cross-sectional view taken along the line A-A in FIG. 27.
Figure 29:
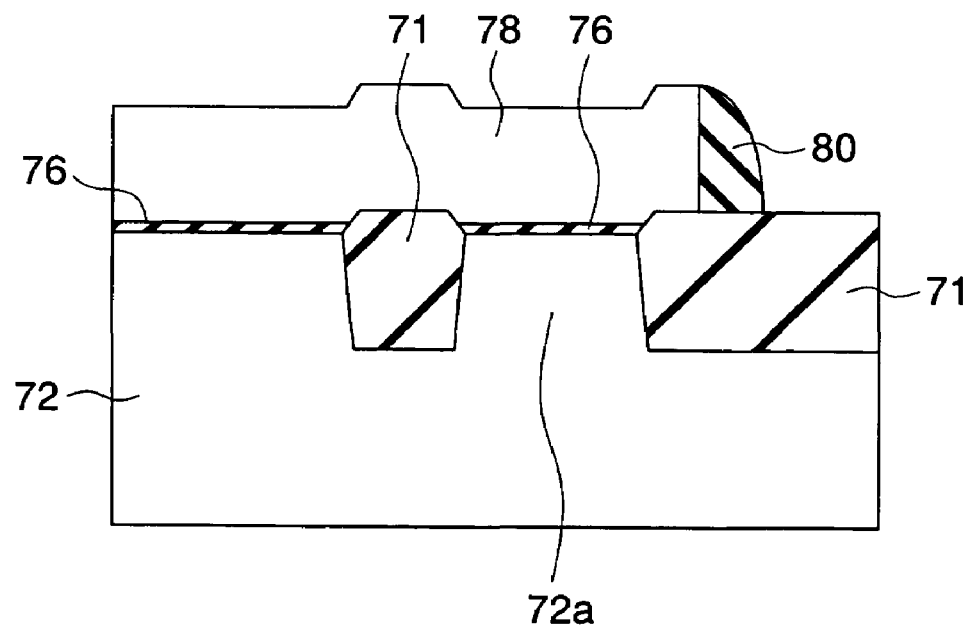
FIG. 29 is a cross-sectional view taken along the line B-B in FIG. 27.

Next, as shown in FIGS. 27 to 29, a TEOS film is deposited by low-pressure chemical vapor deposition (LP-CVD) so as to have a thickness of about 30 nm, and is then etched back by RIE to form the gate side wall 80 on the side faces of the gate electrode 78. It is to be noted that FIG. 27 is a plan view for illustrating a step of the manufacturing method according to the fifth embodiment, FIG. 28 is a cross-sectional view taken along the line A-A in FIG. 27, and FIG. 29 is a cross-sectional view taken along the line B-B in FIG. 27.

Figure 30:
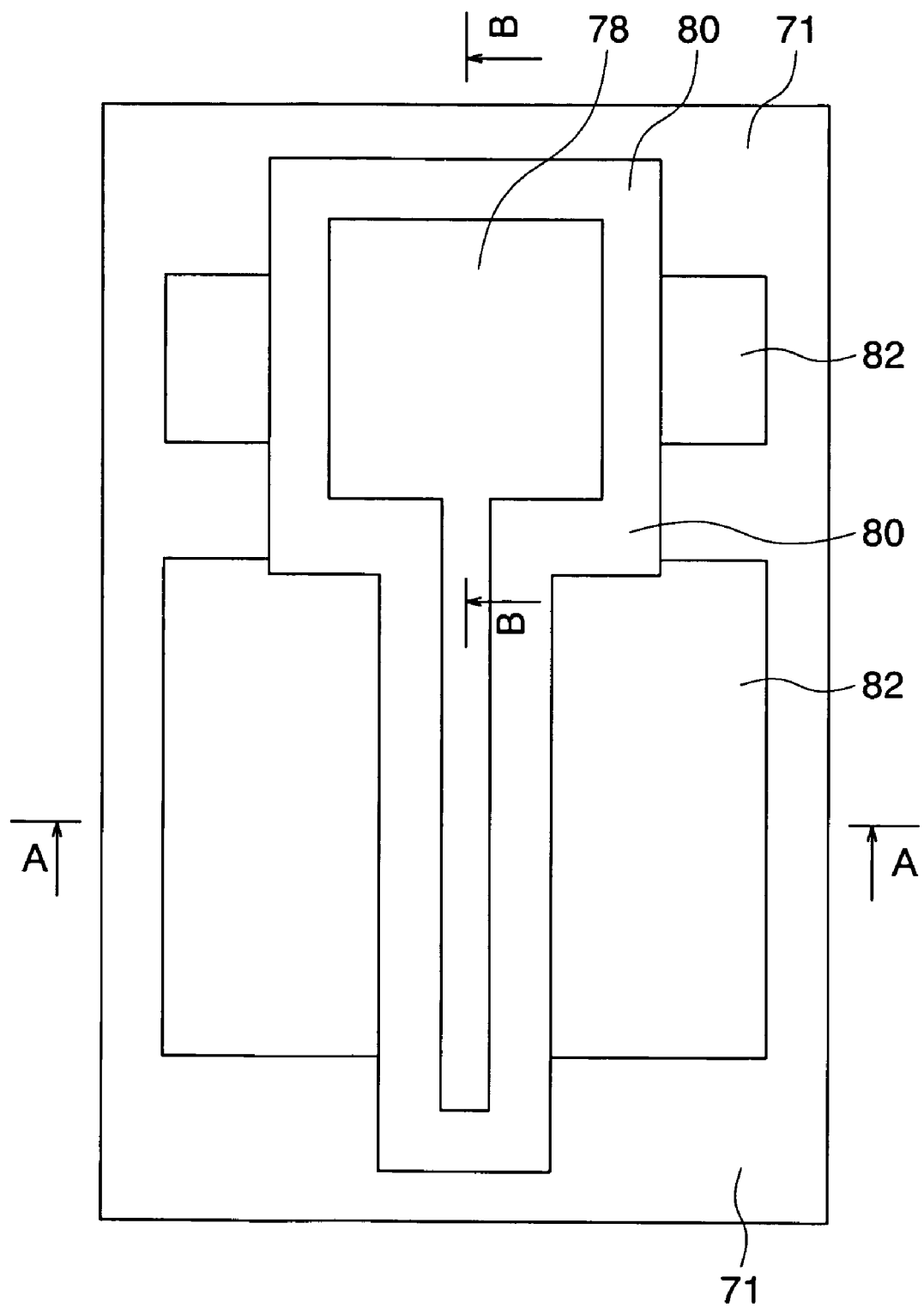
FIG. 30 is a plan view for illustrating a step of a method for manufacturing an ESD protection element according to the fifth embodiment of the present invention.
Figure 31:
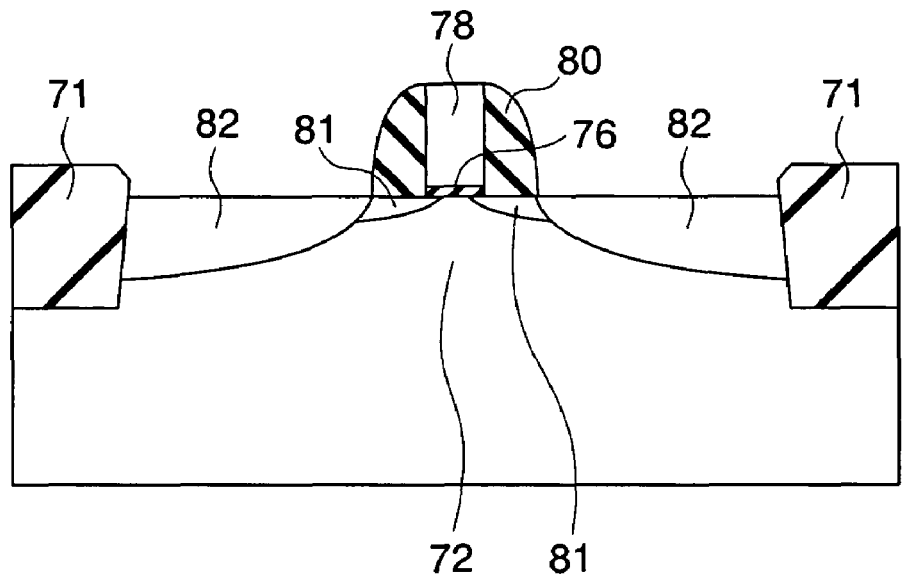
FIG. 31 is a cross-sectional view taken along the line A-A in FIG. 30.
Figure 32:
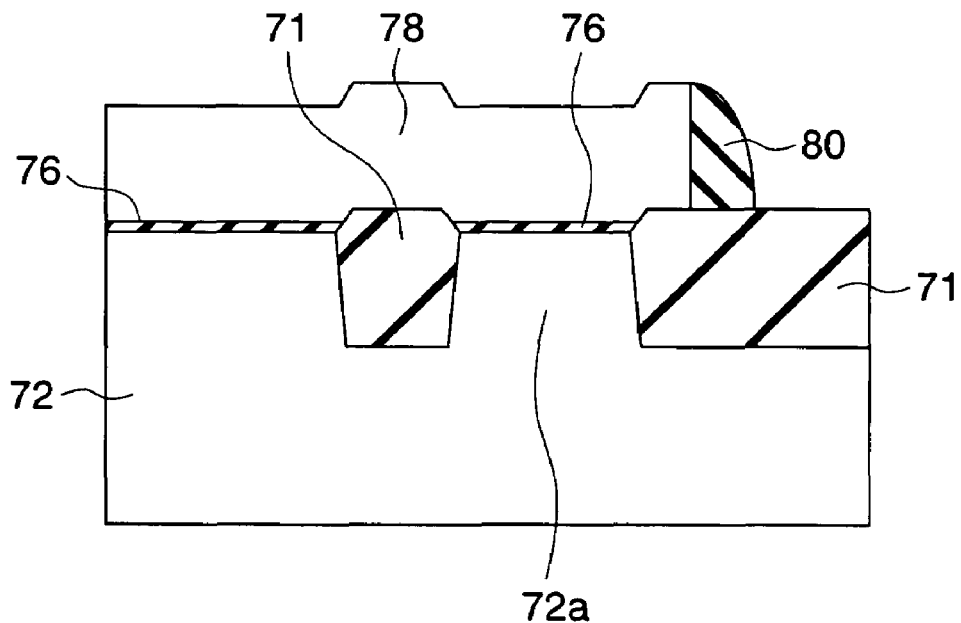
FIG. 32 is a cross-sectional view taken along the line B-B in FIG. 30.

Next, as shown in FIGS. 30 to 32, As ions are implanted into the p-type semiconductor regions 72 and 72a at an accelerating voltage of 30 keV and a dosage of $2\times10^{15}$ cm$^{-2}$ to form the source/drain regions 82. It is to be noted that FIG. 30 is a plan view for illustrating a step of the manufacturing method according to the fifth embodiment, FIG. 31 is a cross-sectional view taken along the line A-A in FIG. 30, and FIG. 32 is a cross-sectional view taken along the line B-B in FIG. 30.

Figure 33:
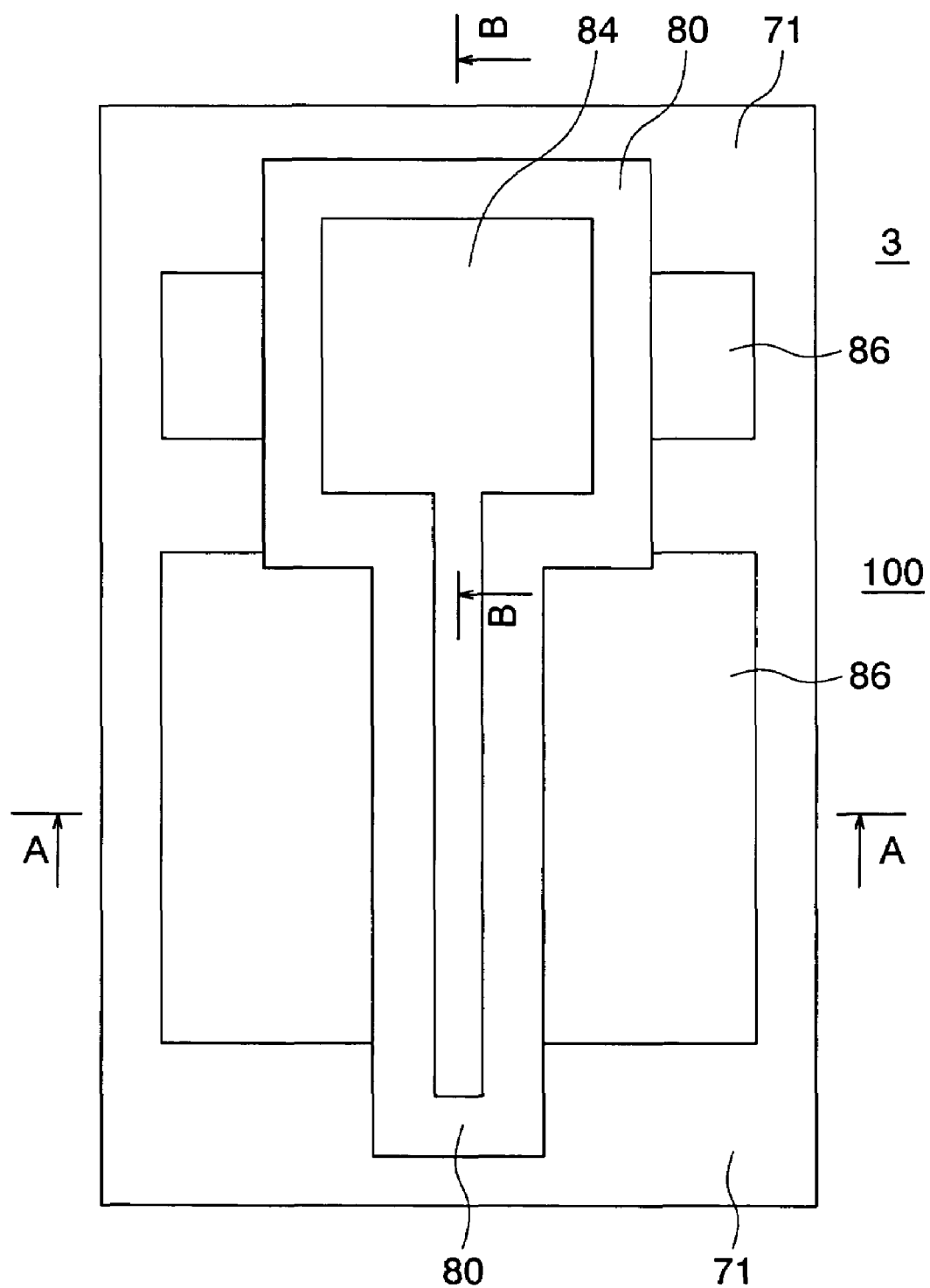
FIG. 33 is a plan view for illustrating a step of a method for manufacturing an ESD protection element according to the fifth embodiment of the present invention.
Figure 34:
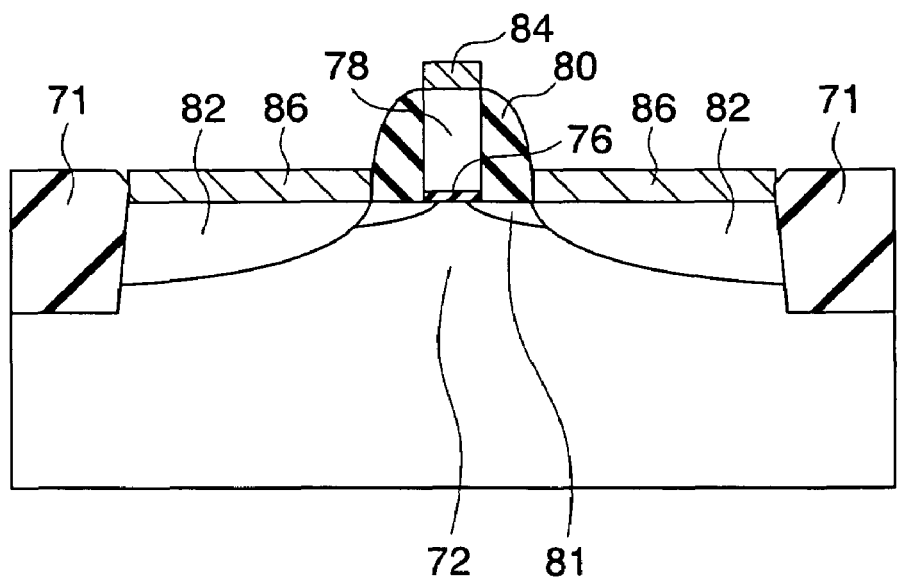
FIG. 34 is a cross-sectional view taken along the line A-A in FIG. 33.
Figure 35:
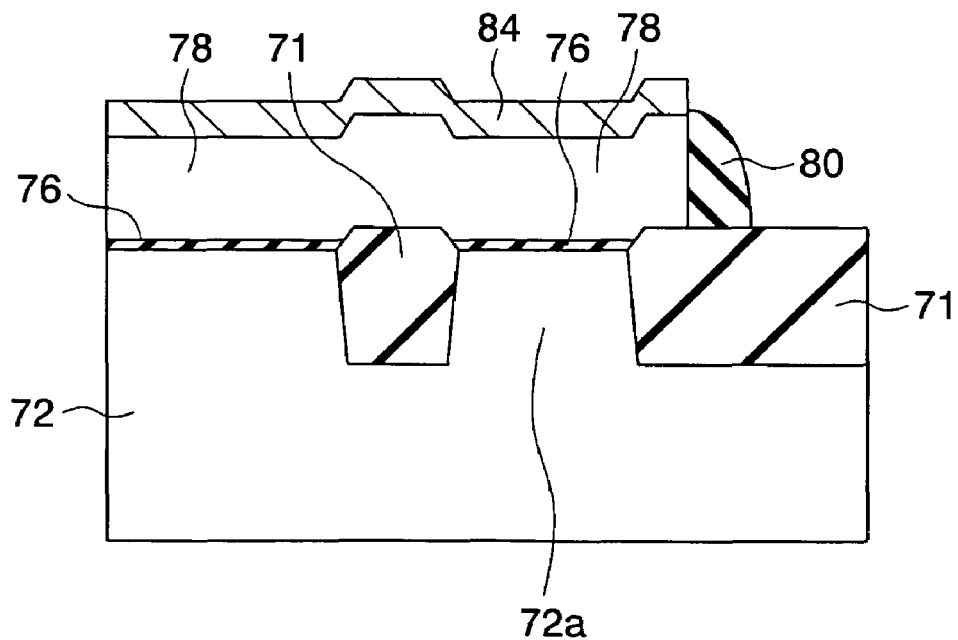
FIG. 35 is a cross-sectional view taken along the line B-B in FIG. 33.

Next, as shown in FIGS. 33 to 35, Ni is sputtered to form an Ni film of about 90 Å, and then heat treatment is carried out at 500° C. for about 30 seconds. Thereafter, unreacted Ni is removed to form the silicide layers 84 and 86 on the gate electrode 78 and the source/drain regions 82, respectively, to thereby obtain an ESD protection element 3 according to the third embodiment and a MOS transistor 100 to be protected.

As in the case of the ESD protection element according to the third embodiment, the ESD protection element manufactured by the method according to the fifth embodiment can also easily set a protection voltage even when a semiconductor device to be protected includes a gate insulating film having a low dielectric breakdown voltage.

It is to be noted that in each of the second to fifth embodiments described above, the semiconductor substrate is a bulk substrate, but an SOI substrate may be alternatively used.

Further, in the fifth embodiment described above, the MOS transistor to be protected is a normal MOS transistor, but may alternatively be a FIN-type MOS transistor. In this case, a FIN-type ESD protection element is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a semiconductor substrate including first and second element regions of first conductivity-type isolated from each other;
a MOS transistor including a first gate insulating film provided on the first element region, a first gate electrode provided on the first gate insulating film, and first impurity regions of second conductivity-type different from the first conductivity-type provided in the first element region on both sides of the first gate electrode; and
an ESD protection element including a second gate insulating film provided on the second element region and having substantially the same thickness as the first gate insulating film, a second gate electrode provided on the second gate insulating film and connected to the first gate electrode, and second impurity regions of second conductivity-type provided in the second element region on both sides of the second gate electrode,
wherein a position of a junction interface between the second impurity region of the second conductivity-type of the ESD protection element and the second element region of the first conductivity-type in the surface of the semiconductor substrate is away from the side face of the second gate electrode on the outer side of the second gate electrode.

2. The semiconductor device according to claim 1, wherein a gate width of the second gate electrode is larger than that of the first gate electrode, and wherein the upper surface of the second gate electrode provides a pad.

3. The semiconductor device according to claim 1, wherein the ESD protection element is a tunnel diode.

4. The semiconductor device according to claim 1, wherein the semiconductor substrate is an SOI substrate.

5. The semiconductor device according to claim 1, wherein the MOS transistor and the ESD protection element are a FIN-type MOS transistor and a FIN-type ESD protection element, respectively.

6. A semiconductor device comprising:
a semiconductor substrate including first and second element regions of first conductivity-type isolated from each other;
a MOS transistor including a first gate insulating film provided on the first element region, a first gate electrode provided on the first gate insulating film, and first impurity regions of second conductivity-type different from the first conductivity-type provided in the first element region on both sides of the first gate electrode; and
an ESD protection element including a second gate insulating film provided on the second element region and having substantially the same thickness as the first gate insulating film, a second gate electrode provided on the second gate insulating film and connected to the first gate electrode, and second impurity regions of second conductivity-type provided in the second element region on both sides of the second gate electrode,
a position of a junction interface between the second impurity region of the second conductivity-type and the second element region of the first conductivity-type of the ESD protection element being away from the second gate insulating film.

7. The semiconductor device according to claim 6, wherein a gate width of the second gate electrode is larger than that of the first gate electrode, and wherein the upper surface of the second gate electrode provides a pad.

8. The semiconductor device according to claim 6, wherein the ESD protection element is a tunnel diode.

9. The semiconductor device according to claim 6, wherein the semiconductor substrate is an SOI substrate.

10. The semiconductor device according to claim 6, wherein the MOS transistor and the ESD protection element are a FIN-type MOS transistor and a FIN-type ESD protection element, respectively.

11. The semiconductor device according to claim 6, wherein each of the first impurity regions of the MOS transistor includes an extension region.

12. The semiconductor device according to claim 11, wherein an edge of the extension region is located under the first gate electrode.

13. The semiconductor device according to claim 6, wherein an edge of each of the first impurity regions of the MOS transistor is located under the first gate electrode.

14. A semiconductor device comprising:
a semiconductor substrate including first and second element regions of first conductivity-type isolated from each other;
a MOS transistor including a first gate insulating film provided on the first element region, a first gate electrode provided on the first gate insulating film, and first impurity regions of second conductivity-type different from the first conductivity-type provided in the first element region on both sides of the first gate electrode; and
an ESD protection element including a second gate insulating film provided on the second element region and having substantially the same thickness as the first gate insulating film, a second gate electrode provided on the second gate insulating film and connected to the first gate electrode, and second impurity regions of the second conductivity-type provided in the second element region on both sides of the second gate electrode,
wherein a gate width of the second gate electrode is larger than that of the first gate electrode, and wherein the upper surface of the second gate electrode provides a pad.

15. The semiconductor device according to claim 14, wherein the ESD protection element is a tunnel diode.

16. The semiconductor device according to claim 14, wherein the semiconductor substrate is an SOI substrate.

17. The semiconductor device according to claim 14, wherein the MOS transistor and the ESD protection element are a FIN-type MOS transistor and a FIN-type ESD protection element, respectively.

* * * * *